(12) United States Patent
Sun et al.

(10) Patent No.: US 10,256,944 B1
(45) Date of Patent: Apr. 9, 2019

(54) CONTROLLING FALSE PACKET ACCEPTANCE

(71) Applicant: Marvell International Ltd., Hamilton (BM)

(72) Inventors: Junqing Sun, Fremont, CA (US); Venugopal Balasubramonian, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 120 days.

(21) Appl. No.: 15/132,900

(22) Filed: Apr. 19, 2016

Related U.S. Application Data

(60) Provisional application No. 62/151,932, filed on Apr. 23, 2015.

(51) Int. Cl.
*H04L 1/00* (2006.01)
*H03M 13/05* (2006.01)
*H03M 13/00* (2006.01)

(52) U.S. Cl.
CPC .......... *H04L 1/0041* (2013.01); *H03M 13/05* (2013.01); *H03M 13/611* (2013.01)

(58) Field of Classification Search
CPC .................................................. H04L 1/0041
See application file for complete search history.

(56) References Cited

U.S. PATENT DOCUMENTS

| | | | | |
|---|---|---|---|---|
| 6,650,638 B1 * | 11/2003 | Walker | .............. | H04L 25/03872 370/389 |
| 6,850,508 B1 * | 2/2005 | Chang | .................. | H04L 1/1642 370/335 |
| 7,043,541 B1 * | 5/2006 | Bechtolsheim | ..... | H04L 41/0663 709/223 |
| 7,203,885 B2 * | 4/2007 | Gibart | ................... | H04L 1/0061 714/755 |
| 7,346,058 B1 * | 3/2008 | Natarajan | ............. | H04L 1/0041 370/392 |
| 2001/0034729 A1 * | 10/2001 | Azadet | .................. | H04L 1/0061 |

(Continued)

OTHER PUBLICATIONS

IEEE Draft P802.3ae/D5.0—Supplement to Carrier Sense Multiple Access with Collision Detection (CSMA/CD) Access Method & Physical Layer Specifications—Media Access Control (MAC) Parameters, Physical Layer, and Management Parameters for 10 Gb/s Operation, LAN MAN Standards Committee of the IEEE Computer Society, May 1, 2002, 540 pages.

(Continued)

*Primary Examiner* — Steve N Nguyen

(57) ABSTRACT

A device includes a network interface that includes a physical coding sublayer (PCS) unit. The PCS unit receives an Ethernet packet. The PCS unit encode the Ethernet packet into a transmission frame that includes a first set of bit fields corresponding to contents of the Ethernet packet and a second set of bit fields corresponding to control information for the encoding. The PCS unit computes a validity value of the transmission frame, wherein the validity value is based on the first set of bit fields included in the transmission frame. The PCS unit inserts the validity value of the transmission frame into one or more idle bit fields in the second set of bit fields included in the transmission frame. The PCS unit processes the transmission frame for sending to a receiving device over a physical medium.

20 Claims, 10 Drawing Sheets

(56) References Cited

U.S. PATENT DOCUMENTS

| | | | | |
|---|---|---|---|---|
| 2004/0156390 A1* | 8/2004 | Prasad | .................. | H04J 3/1617 |
| | | | | 370/466 |
| 2004/0252644 A1* | 12/2004 | Constantinescu | ....... | H04L 43/50 |
| | | | | 370/242 |
| 2005/0102419 A1* | 5/2005 | Popescu | .................. | H04L 43/00 |
| | | | | 709/238 |
| 2015/0135041 A1* | 5/2015 | O'Connell | ............ | H04L 1/0041 |
| | | | | 714/776 |
| 2015/0222533 A1* | 8/2015 | Birrittella | ............... | H04L 45/66 |
| | | | | 370/392 |

OTHER PUBLICATIONS

P. Koopman, "32-bit cyclic redundancy codes for internet applications," Conf. Dependable Systems and Networks (DSN), Jul. 2002.

Cideciyan et al., "Double Burst Error Detection Capability of Ethernet CRC", IEEE 802.3bj Task Force, Jul. 16-19, 2012, downloaded from Internet, http://www.ieee802.org/3/bj/public/jul12/cideciyan_01_0712.pdf, 13 pages.

Andre Szczepanek, "802.3ap MTTFPA calculations", IEEE, Nov. 2005, downloaded from Internet, http://www.ieee802.org/3/ap/public/nov05/szczepanek_01_1105.pdf, 12 pages.

Norival Figueira, "Impact of the x43+1 Scrambler on the Error Detection Capabilities of the Ethernet CRC", IEEE 802.3 HSSG Meeting, Jul. 5-8, 1999, downloaded from Internet, http://grouper.ieee.org/groups/802/3/10G_study/public/july99/figueira_1_0799.pdf, 33 pages.

* cited by examiner

CONTROLLING FALSE PACKET ACCEPTANCE

CROSS REFERENCE TO RELATED APPLICATIONS

This application claims the benefit of priority under 35 U.S.C. § 119(e) of U.S. Provisional Application No. 62/151,932, filed on Apr. 23, 2015, and entitled "Ethernet MTTFPA," which is incorporated herein by reference in its entirety.

BACKGROUND

The following disclosure relates generally to systems and techniques for controlling false packet acceptance.

Information can be sent from a network device to another network device as data packets, e.g., Ethernet packets, over network connections. Sometimes errors can be introduced into the data packets while sending over the network connections. In some cases, error checking at the receiving network device may not detect some types of errors and so corrupted data packets may be improperly accepted as valid at the receiving network device.

SUMMARY

The present disclosure describes systems and techniques for controlling Mean Time to False Packet Acceptance (MTTFPA) at a receiving network device (also referred to as a receiver) when errors are introduced into encoded data packets, such as Ethernet packets encoded into transmission frames, during sending via network connections. For example, the contents of an Ethernet packet, encoded into a transmission frame using 64B/66B line code (henceforth referred to as a 64B/66B encoded transmission frame), may change due to errors during transmission over a network connection. Such an encoded Ethernet packet may be incorrectly processed as valid by a receiver if standard error checking fails at the receiver. In some implementations, such errors are addressed by a transmitting network device (also referred to as a transmitter) inserting an additional length value about the Ethernet packet into the transmission frame before sending over the network connection. The receiver checks the additional length value to determine whether to accept or reject the encoded Ethernet packet. Additionally or alternatively, in some implementations the transmitter inserts into the transmission frame an additional error detection code value computed on the contents of the Ethernet packet, before sending the encoded transmission frame over the network connection to the receiver. The receiver checks the additional error detection code value to determine whether to accept or reject the encoded Ethernet packet In a general aspect, a device includes a network interface that includes a physical coding sublayer (PCS) unit. The PCS unit receives an Ethernet packet. The PCS unit encode the Ethernet packet into a transmission frame that includes a first set of bit fields corresponding to contents of the Ethernet packet and a second set of bit fields corresponding to control information for the encoding. The PCS unit computes a validity value of the transmission frame, wherein the validity value is based on the first set of bit fields included in the transmission frame. The PCS unit inserts the validity value of the transmission frame into one or more idle bit fields in the second set of bit fields included in the transmission frame. The PCS unit processes the transmission frame for sending to a receiving device over a physical medium.

Particular implementations may include one or more of the following features. Computing the validity value of the transmission frame may include computing a length value of the transmission frame, wherein the length value indicates a number of bits in the first set of bit fields included in the transmission frame. Computing the validity value of the transmission frame may include computing a first error-detecting code value of the transmission frame, wherein the first error-detecting code value is based on contents of the first set of bit fields, and wherein the contents of the first set of bit fields includes an existing second error-detecting code value present in the Ethernet packet.

Encoding the Ethernet packet into the transmission frame may include encoding the Ethernet packet using 64B/66B line code into a transmission frame that includes 64 octets in the first set of bit fields and a terminating block including the second set of bit fields. Inserting the validity value of the transmission frame into one or more idle bit fields of the second set of bit fields may include determining, in the terminating block of the transmission frame, position of an end of packet (EOP) bit field, and inserting the validity value into one or more idle bit fields adjacent to the EOP bit field.

In another general aspect, an Ethernet packet is received at a physical coding sublayer (PCS) unit in a network interface of a transmitting device, The PCS unit encodes the Ethernet packet into a transmission frame that includes a first set of bit fields corresponding to contents of the Ethernet packet and a second set of bit fields corresponding to control information for the encoding. The PCS unit computes a validity value of the transmission frame, wherein the validity value is based on the first set of bit fields included in the transmission frame. The PCS unit inserts the validity value of the transmission frame into one or more idle bit fields in the second set of bit fields included in the transmission frame. The PCS unit processes the transmission frame for sending to a receiving device over a physical medium.

Particular implementations may include one or more of the following features. Encoding the Ethernet packet into the transmission frame may include encoding the Ethernet packet using 64B/66B line code into a transmission frame that includes 64 octets in the first set of bit fields and a terminating block including the second set of bit fields. The validity value may include a length value of the transmission frame that indicates a number of bits in the first set of bit fields included in the transmission frame. Inserting the length value of the transmission frame into one or more idle bit fields of the second set of bit fields may include determining, in the terminating block of the transmission frame, one or more idle bit fields following an end of packet (EOP) bit field, and inserting the length value into the one or more idle bit fields. The length value may be encoded as a 14-bit data, and the 14-bit data may be inserted into two idle bit fields following the EOP bit field.

Encoding the Ethernet packet into the transmission frame may include encoding the Ethernet packet using 64B/66B line code into a transmission frame that includes 64 octets in the first set of bit fields and a terminating block including the second set of bit fields that includes a type bit field. The validity value may include a length value of the transmission frame that indicates a number of bits in the first set of bit fields included in the transmission frame. Inserting the length value of the transmission frame into one or more idle bit fields of the second set of bit fields may include adding, in the terminating block of the transmission frame, one or more bit fields that include the length value preceding an end of packet (EOP) bit field, and updating the type bit field in the terminating block to indicate adjusted location of the EOP bit field in the terminating block. The length value may be encoded as a 16-bit data, and the 16-bit data may be inserted into two idle bit fields preceding the EOP bit field.

Computing the validity value of the transmission frame may include computing a first error-detecting code value of the transmission frame, and inserting the first error-detecting code value into one or more available bit fields in the second set of bit fields. The first error-detecting code value may be based on contents of the first set of bit fields, and the contents of the first set of bit fields may include an existing second error-detecting code value present in the Ethernet packet. The first error-detecting code value may include a cyclic redundancy check (CRC) value of the first set of bit fields, and the second error-detecting code value included in the Ethernet packet may include a 32-bit CRC value included in a frame check sequence (FCS) portion of the Ethernet packet. The first CRC value may include one of an 8-bit CRC value or a 16-bit CRC value.

In another general aspect, a transmission frame sent by a transmitting device is received at a physical coding sublayer (PCS) unit in a network interface of a receiving device. The transmission frame encodes an Ethernet packet and includes a first set of bit fields corresponding to contents of the Ethernet packet and a second set of bit fields corresponding to control information for the encoding. One or more bit fields are identified in the transmission frame that include a validity value of the transmission frame. The validity value is based on the first set of bit fields included in the transmission frame. Based on identifying the one or more bit fields, the validity value of the transmission frame is obtained from the one or more bit fields. A second validity value of the transmission frame is computed based on the first set of bit fields. The second validity value of the transmission frame is compared to the validity value obtained from the one or more bit fields. Conditioned on determining that the second validity value equals the validity value obtained from the one or more bit fields, the Ethernet packet is obtained from the first set of bit fields in the transmission frame.

Particular implementations may include one or more of the following features. The one or more bit fields that include the validity value of the transmission frame may be part of a terminating block of the transmission frame that further includes a type bit field. Identifying the one or more bit fields that include the validity value of the transmission frame may include obtaining a value of the type bit field in the terminating block. Based on the value of the type bit field, a location of the one or more bit fields that include the validity value of the transmission frame may be determined in the terminating block. Determining the location of the one or more bit fields in the terminating block based on the value of the type bit field may include determining, based on the type bit field having a first value, that the one or more bit fields follow an end of packet (EOP) bit field in the terminating block. Based on the type bit field having a second value, a determination may be made that the one or more bit fields precede the EOP bit field in the terminating block.

The validity value may include a length value of the transmission frame that indicates a number of bits in the first set of bit fields included in the transmission frame. The length value may be encoded as a 14-bit data that is inserted into two idle bit fields following the EOP bit field. The length value may be encoded as a 16-bit data that is inserted into two idle bit fields preceding the EOP bit field.

The validity value may include a first error-detecting code value of the transmission frame that is based on contents of the first set of bit fields. The contents of the first set of bit fields may include an existing second error-detecting code value present in the Ethernet packet. The first error-detecting code value may include a cyclic redundancy check (CRC) value of the first set of bit fields. The second error-detecting code value included in the Ethernet packet may include a 32-bit CRC value included in a frame check sequence (FCS) portion of the Ethernet packet. The first CRC value may include one of an 8-bit CRC value or a 16-bit CRC value.

Implementations of the above techniques include systems, methods, computer program products and computer-readable media. One such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above described actions.

The systems and techniques for inserting additional length value or error detection code value into a transmission frame can lead to a reduction in false packet acceptance errors at the receiver. For example, the systems and techniques can improve the MTTFPA such that it is greater than a target value, e.g., the Age of the Universe (AOU) metric. The systems and techniques can be implemented with limited changes to the network interface circuit at the transmitter or the receiver, or with limited modifications to the line code used to encode the data packet. For example, the systems and techniques can be implemented by replacing some of the mandatory idle bit fields in the terminal block of a 64B/66B encoded transmission frame with the additional length value or error detection code value.

The details of one or more disclosed implementations are set forth in the accompanying drawings and the description below. Other features, aspects, and advantages will become apparent from the description, the drawings and the claims.

DETAILED DESCRIPTION

Network devices, which are connected to one another in a network, such as a local area network (LAN) or a wide area network (WAN), can transfer electronic data amongst themselves over the network connections as data packets. For example, network devices can transfer data using Ethernet packets in a LAN that implements Ethernet links.

Figure 1:
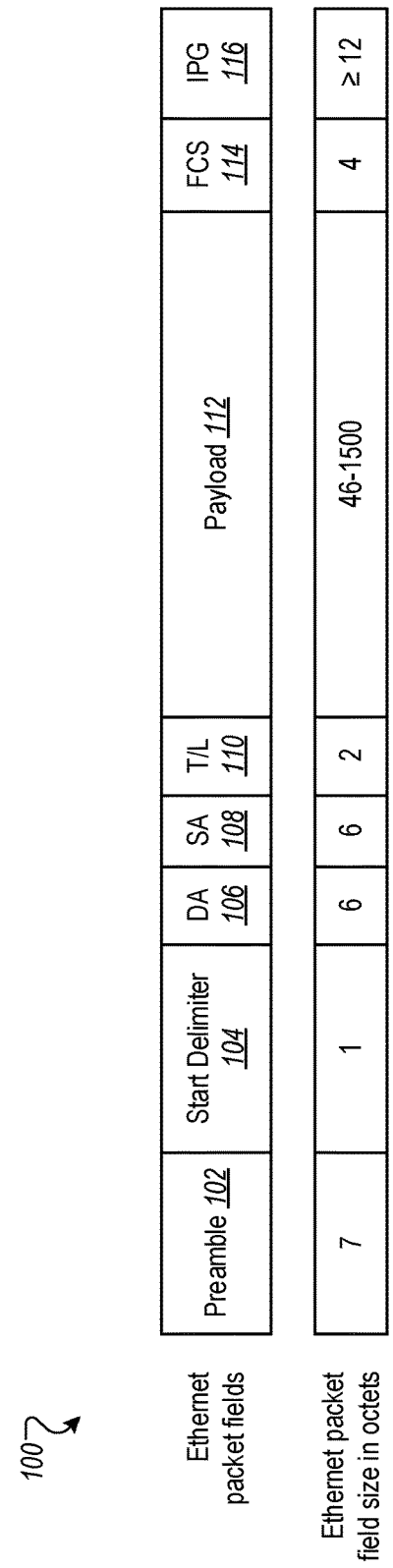
FIG. 1 illustrates a block diagram of an example of an Ethernet packet.

FIG. 1 illustrates a block diagram of an example of an Ethernet packet 100. The Ethernet packet 100 includes several bit fields, such as a preamble 102, a start frame delimiter (SFD) 104, destination address (DA) 106, source address (SA) 108, type/length (T/L) 110, payload 112, frame check sequence (FCS) 114 and interpacket gap (IPG) 116.

The preamble 102 is a 7-octet bit field that includes a pattern of alternating 1 and 0 bits, which is used by network devices in a LAN to synchronize their receiver clocks. The preamble 102 is followed by the SFD 104, which is a 1-octet value that indicates the beginning of the data portion of the Ethernet packet that is transferred among the network devices. In some implementations, the portion of the Ethernet packet following the SFD 104, which includes the DA 106, the SA 108, the T/L 110, the payload 112 and the FCS 114, is referred to as the Ethernet frame. The SFD 104 is designed to break the bit pattern of the preamble 102 and signal the start of the Ethernet frame.

The DA 106 provides the destination medium access control (MAC) address, i.e., the address of the receiver of the Ethernet packet, and the SA 108 provides the source MAC address, i.e., the address of the transmitter that sent the Ethernet packet. Each of DA 106 and SA 108 is 6-octets in length. Network interface hardware in the network devices in the LAN look up the DA 106 and the SA 108 to determine how to send the Ethernet packet from the transmitter to the receiver.

The T/L field 110 is two octets long and it can be used for two different purposes. Values of 1500 and below indicate that T/L 110 is used to indicate the length of the payload 112 in octets, while values of 1536 and above indicate that it is used as a type field (e.g., EtherType) to indicate which protocol is encapsulated in the payload 112. When T/L 110 is used as a type field, the length of the payload 112 is determined by the location of the IPG 116 and valid FCS 114.

The payload 112 carries data for higher layers in the network protocol stack, e.g., Internet Protocol (IP) data, or some other suitable protocol data. In some implementations, the payload includes additional fields, such as a logical link control (LLC) field, and/or padding bits at the end of the protocol data. The payload 112 content is in the form of an arrangement of 1 and 0 bits. In some implementations, the length of the payload 112 is between 46 and 1500 octets. In some implementations, the payload 112 length can be greater, e.g., when jumbo Ethernet frames are allowed in the LAN.

The FCS 114 is a bit field that includes a four-octet error detection code value, which is used by a receiver to detect corrupted data within the Ethernet frame when received at the receiver. In some implementations, a cyclic redundancy check (CRC) algorithm, e.g., 32-bit CRC code (CRC32), is used as the error detection code in the FCS 114. The FCS value is computed as a function of the contents of the Ethernet frame fields DA 106, SA 108, T/L 110 and payload 112. When a CRC code is used, the transmitter computes a CRC parity value over these fields and inserts the CRC parity value in the FCS field 114. At the receiver, running the same CRC algorithm over the contents of these Ethernet frame fields and the FCS 114 will result in a zero value if there are no errors in the Ethernet frame during transmission on the network. In some implementations, the FCS 114 value is complemented (reversed for each bit) by the transmitter before it is attached to the end of the payload 112.

The IPG 116 represents idle time between Ethernet packets. Following sending an Ethernet packet, a transmitter transmits 12 or more octets of idle line state before transmitting the next Ethernet packet.

A network device includes a network interface, which can perform a series of functions to process data for transmission or reception over a network. These functions can be grouped into one or more different logical groups depending on relatedness of the functionalities. These logical groups are referred to as protocol layers of a network protocol stack implemented in the network interface. For example, the functions of a network interface in a network device can be partitioned into one or more network protocol layers of the Open Systems Interconnection (OSI) model of the International Organization for Standardization (ISO), such as the transport layer, network layer, data link layer and physical layer, among others.

Figure 2:
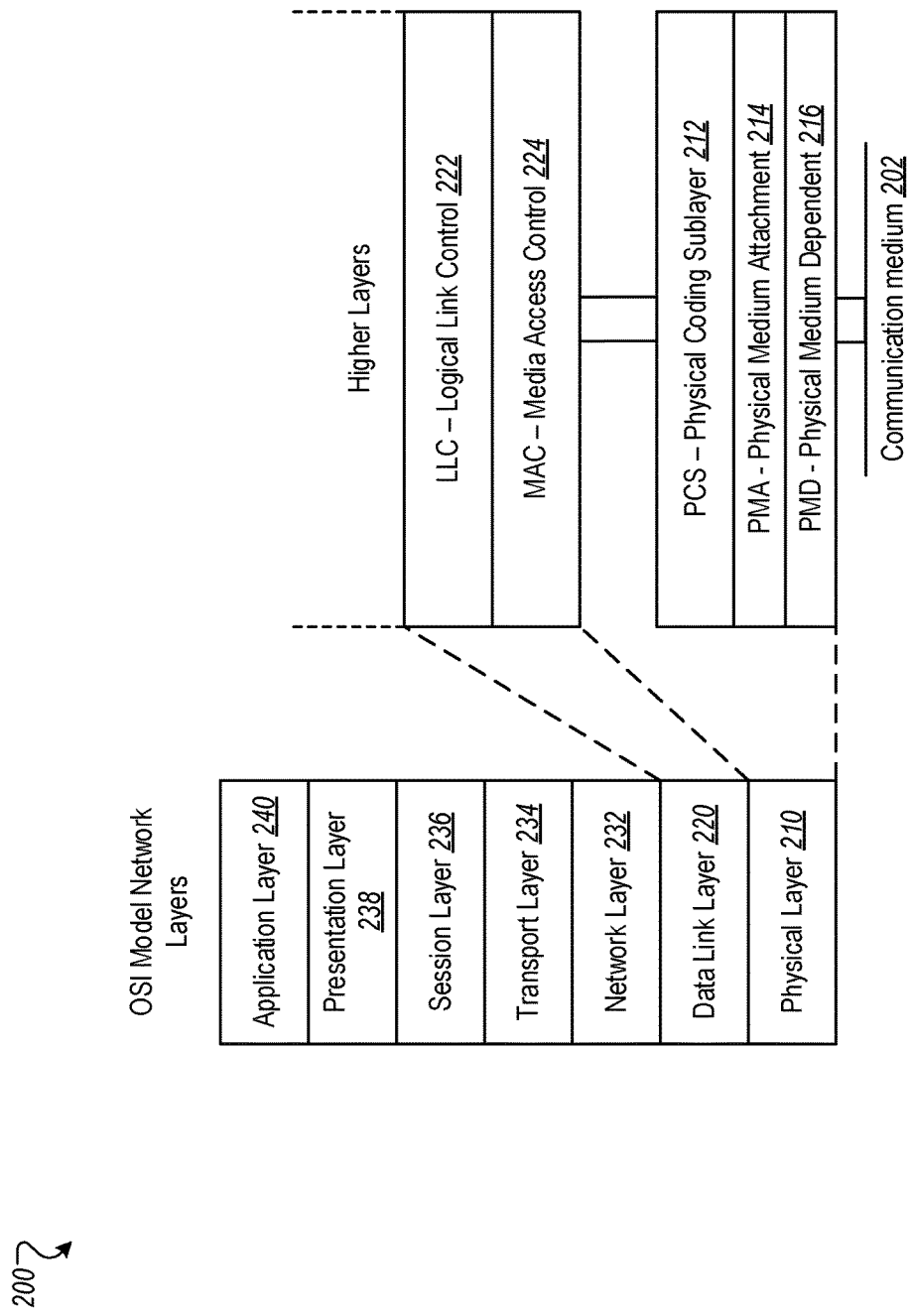
FIG. 2 illustrates a block diagram of an example of a network protocol stack for processing Ethernet packets.

FIG. 2 illustrates a block diagram of an example of a network protocol stack 200 for processing Ethernet packets. In some implementations, the network protocol stack 200 is implemented in a network interface of a transmitter or a receiver that processes Ethernet packets for communicating over network connections.

The network protocol stack 200 includes functionalities of one or more layers of the OSI model network layers, such as the physical layer 210, the data link layer 220, the network layer 232, the transport layer 234, the session layer 236, the presentation layer 238 and the application layer 240. In some implementations, the network protocol stack 200 includes functionalities of all these layers of the OSI model, while in other implementations the network protocol stack 200 includes functionalities of a subset of these layers of the OSI model. Network interfaces of network devices implement the functionalities of these network layers to process electronic data for transmission between the network devices over the communication medium 202.

Ethernet packets are processed by network functionality at the data link layer 220. For example, the network interface of a transmitter receives electronic data from higher layers, such as an IP packet from the network layer 232, and executes hardware and/or software network processes or routines associated with the data link layer 220 to generate an Ethernet packet, which includes the higher layer data in the payload portion of the packet (e.g., payload 112).

In some implementations, the functionality of the data link layer 220 is divided into two or more sublayers, such as the logical link control (LLC) layer 222 and the media access control (MAC) layer 224. The LLC layer 222 is configured to identify higher layer protocols, e.g., network layer protocols, and encapsulate data received from the higher layers to generate data link layer packets. The LLC layer 222 is also configured to control error checking and packet synchronization. The MAC layer 224 is configured to control how network devices transmit or receive data packets, such as Ethernet packets, e.g., when multiple transmissions between different groups of transmitters and receivers are to be made over a same physical communication medium, such as the communication medium 202.

An Ethernet packet generated by the data link layer 220 is further processed by functionality of the physical layer 210 to prepare the packet for transmission over the physical communication medium 202. In some implementations, the functionality of the physical layer 210 is divided into several sublayers, such as the physical coding sublayer (PCS) 212, the physical medium attachment (PMA) sublayer 214 and the physical medium dependent (PMD) sublayer 216, among others.

The PCS 212 is implemented in network protocol stacks for supporting Fast Ethernet, Gigabit Ethernet, 10 Gigabit Ethernet (10 G Ethernet) and 25 Gigabit Ethernet (25 G Ethernet) standards, among others, which are defined by the Institute of Electrical and Electronics Engineers (IEEE) 802.3 collection of standards. The IEEE 802.3 standards describe the functionalities of the physical layer and data link layer in a network protocol stack that supports wired Ethernet in LAN and WAN applications.

The PCS 212 provides an interface between the functionalities of the data link layer 220 and the functionalities of other sections of the physical layer 210, such as PMA sublayer 214 and the PMD sublayer 216. The PCS 212 is responsible for various functions, including encoding/decoding of data packets into transmission frames using suitable line codes. For example, the PCS 212 is configured to encode Ethernet packets into 64B/66B encoded transmission frames using 64B/66B line code. The PCS 212 is also configured to perform other functions, such as scrambling/descrambling, alignment marker insertion/removal, and block and symbol redistribution, among others.

The PMA 214, which provides a medium-independent means for the PCS 212 to support the use of a range of physical media, is configured to perform framing, octet synchronization/detection and scrambling/descrambling, among other functions. The PMD 216 corresponds to a transceiver for the physical medium. More detailed descriptions of the data link layer 220 and the physical layer 210, including LLC 222, MAC 224, PCS 212, PMA 214 and PMD 216, can be found in the IEEE 802.3 standards, including IEEE Draft P802.3ae and IEEE P802.3-2015, among others.

As noted above, in some implementations, the PCS 212 in a transmitter uses a suitable line code (also referred to as a transmission code) to encode an Ethernet packet, which is received from the data link layer 220, into a transmission frame that is forwarded to the PMA 214 and PMD 216 for further processing before sending to a receiver over the communication medium 202 as a bit stream. At the receiver, the PMA 214 and/or the PMD 216 in the receiver network interface processes the bit stream received from the communication medium 202 and retrieves the transmission frame, which is forwarded to the PCS 212 in the receiver network interface. The PCS 212 decodes the transmission frame using the same line code and obtains the Ethernet packet sent by the transmitter.

The PCS 212 uses a line code to improve the transmission characteristics of information to be transferred across the link and to support transmission of control and data characters. The encodings defined by the line code ensure that sufficient transitions are present in the physical bit stream to make clock recovery possible at the receiver. The encoding also preserves the likelihood of detecting any single or multiple bit errors that may occur during transmission of the data over the communication medium 202. In addition, the synchronization headers of the line code enable the receiver to achieve block alignment on the incoming physical bit stream.

In some implementations, the line code used by the PCS 212 is 64B/66B line code. For example, the PCS 212 uses the 64B/66B line code to encode Ethernet packets for transmission over 10 G Ethernet or 25 G Ethernet links, among others. The 64B/66B line code enables reasonable clock recovery and facilitates alignment of the data stream at the receiver. When 64B/66B line code is used, the PCS 212 encodes 64 bits of Ethernet packet data into a 66-bit block of the transmission frame by prefixing a 2-bit preamble to the 64 bits of data. If the preamble is '01', the following 64 bits in the block are entirely data. If the preamble is '10', an eight-bit type field follows, and the remaining 56 bits in the block may be control information and/or data. In this manner, upon using 64B/66B line code, a 64-octet Ethernet packet is encoded in a transmission frame of 10 blocks, with 66 bits in each block.

Figure 3:
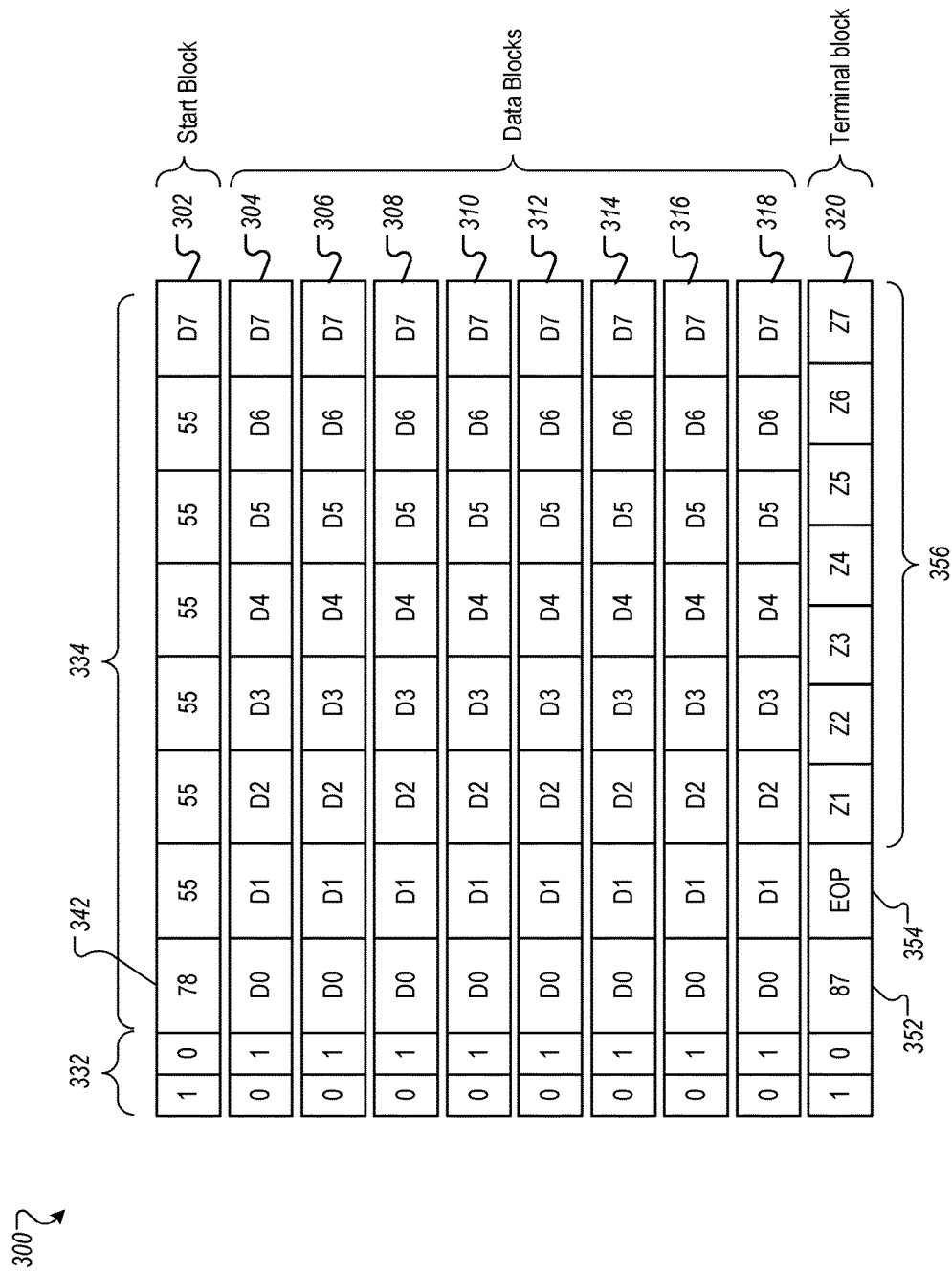
FIG. 3 illustrates a block diagram of an example of a 64B/66B encoded transmission frame.

FIG. 3 illustrates a block diagram of an example of a 64B/66B encoded transmission frame 300. The transmission frame 300 includes ten blocks 302, 304, 306, 308, 310, 312, 314, 316, 318 and 320.

Each block of the transmission frame 300 includes two preamble bits 332, followed by 64 bits of control information, data, or idle fields, or some suitable combination of these. The block 302 is the start block of the transmission frame 300. The start block 302 includes the two preamble bits 332, followed by eight octets 334. The preamble bits 332 of the block 302 have the value '10', indicating that the block 302 is a control block. The first octet 342 of the block 302 represents a type field. The octet 342 has value 78, indicating that the block 302 is the start block of the transmission frame. The remaining octets of the block 302 are either control octets (e.g., an 8-bit field that includes control information such as with value 55), or data octets (e.g., an 8-bit field that includes data content, such as with value D7). As shown, block 302 is a mixed command/data block, with both control octets and a data octet.

The blocks 304-318 are data blocks, with the two preamble bits 332 in each of these blocks having the value '01', indicating that these are data blocks. In each of blocks 304-318, the preamble bits 332 are followed by eight data octets 334 (e.g., D0, D1, D2, D3, D4, D5, D6 and D7). The PCS 212 encodes an Ethernet packet received from the data link layer 220 into the data blocks 304-318. In some implementations, the encoded Ethernet packet can be a 10BASE-T Ethernet packet, a Fast Ethernet packet, a Gigabit Ethernet packet, a 10 G Ethernet packet, or a 25 G Ethernet packet, or some other suitable data packet. In some implementations, portions of an Ethernet packet are encoded into the data blocks of more than one transmission frame. This may be the case, for example, when the length of the Ethernet packet is greater than the total size of the data blocks, e.g., 64 octets. In other implementations, an entire Ethernet packet is encoded into the data blocks of one transmission frame. This may be the case, for example, when the length of the Ethernet packet is less than the total size of the data blocks, e.g., 64 octets.

The block 320 is the terminal block of the transmission frame 300. The two preamble bits 332 of the block 320 have the value '10', indicating that the block 320 is a control block. The first octet 352 of the block 320 represents a type field, which has value 87, indicating that the block 320 is the terminal block of the transmission frame 300. The type field octet 352 is followed by eight 7-bit fields, of which the first is an end of packet (EOP) field 354. In some implementations, the EOP field 354 may be at a different location in the block 320.

The remaining 7-bit fields in the block 320 are idle fields 356 (e.g., Z1, Z2, Z3, Z4 Z5, Z6 and Z7). In some implementations, the idle fields 356 do not include information that is useful to the higher layers (e.g., Ethernet packet data), but are used to separate one 64B/66B encoded transmission frame from the next 64B/66B encoded transmission frame. In some implementations, at least four idle fields (e.g., Z4-Z7) are used to separate one transmission frame from the start block of the next transmission frame. The PCS 212 in a receiver ignores the idle fields in a transmission frame after the EOP field 354, till a next preamble 332 with the value '10' is received, indicating that the start block of a new 64B/66B encoded transmission frame that is received. The idle fields may be indicated by a particular arrangement of bits in these fields, e.g., '0000000', '1111111', '0101010', or some other suitable arrangement. A more detailed description of the 64B/66B line code can be found in the IEEE 802.3 standards, including IEEE Draft P802.3ae and IEEE P802.3-2015, among others.

In some implementations, data that is sent from a transmitter to a receiver encounters one or more errors during transmission. For example, one or more bits in a transmission frame, encoded using 64B/66B line code, may be flipped (e.g., a 0 bit value changing to a 1 bit value or vice versa) while sending over the communication medium. Such errors may be introduced due to various factors, e.g., noise in the communication channel.

The errors may occur in one or more octets of the start block (e.g., start block 302), in one or more octets of the data blocks (e.g., data blocks 304-318), or in one or more octets of the terminal block (e.g., terminal block 320), or any combination of these. The errors may occur in the preamble bits (e.g., 332), the control octets (e.g., type fields 342, or 352, or EOP field 354, among others), or the data octets (e.g., D0, D1, D2, D3, D4, D5, D6, or D7 octets in the blocks 304-318), or a combination of these.

When a 64B/66B encoded transmission frame is received at the PCS in the network protocol stack of a receiver, the PCS checks one or more fields in the encoded transmission frame to ensure that the transmission frame has not been corrupted while being sent from the transmitter over the physical communication channel. In some implementations, the PCS in the receiver checks the first 10 bits in the start block (e.g., preamble 332 and the type field octet 342 in the start block 302), the data octets in the data blocks (e.g., D0-D7 in data blocks 304-318) and 64 bits in the terminal block (e.g., the type field 352, the EOP field 354 and the idle fields 356 in the terminal block 320). In some implementations, the PCS in the receiver checks an additional number of fields, or a lesser number of fields, in the transmission frame.

In some implementations, the error detection code value in the FCS field in the encoded Ethernet packet (e.g., FCS 114) is used to detect errors that occur in the Ethernet packet encoded in the data blocks of the transmission frame. For example, when CRC32 is used as the error detection code, the PCS at the receiver can use the CRC32 parity value in the FCS field to detect different kinds of bit errors in the encoded Ethernet packet. For example, for Ethernet packets up to 9 kilo-bytes in size, CRC32 can be used to detect up to three random bit errors, two bursts of up to 8 bits, or one burst of up to 32 bits, when such bit errors are limited to the data octets of the data blocks in the transmission frame (i.e., the contents of the encoded Ethernet packet).

However, error detection using the value in the FCS field of the encoded Ethernet packet can be compromised if errors occur elsewhere in the transmission frame. In some implementations, errors occur in the preamble bits 332 of a block, or a type field (e.g., 342 or 352) in a block, or there is error spill-in or spill-out (e.g., errors from one transmission frame continue to the next transmission frame). Such errors can occur, for example, when errors introduced due to decision feedback equalization (DFE) of a transmission frame are propagated across transmission frames. Such errors can corrupt the structure of the transmission frame. In such cases, the PCS at the receiver may not be able to reliably locate the position of the FCS field of the Ethernet packet encoded in the data blocks of the transmission frame. This may be the case, for example, because the receiver PCS may not be able to reliably determine the start or end of a block due to the errors noted above. Accordingly, the receiver PCS cannot reliably use the error detection code value in the FCS field of the encoded Ethernet packet to detect errors in the Ethernet packet.

Errors in the preamble bits of a block, in a type field of a transmission frame, or error spill-in/spill-out due to DFE error propagation, can be manifested in several different ways. For example, in one case, an error in a block preamble or a type field of a transmission frame can occur if the preamble bits of a data block are changed to '10', but the type field is valid. In such a case, the corresponding data block may be read as a terminal block, and thereby the encoded Ethernet packet may be shortened. Additionally or alternatively, the preamble bits of a terminal block can be changed to '01', and thereby the terminal block may be mistakenly identified as a data block by the receiver PCS. Additionally or alternatively, the type field of a start block (e.g., type field 342) can be corrupted, which can change the location of the start of packet (SOP). Additionally or alternatively, the type field of a terminal block (e.g., type field 352) can be corrupted, which can change the location of the end of packet (EOP) in the terminal block. Other error cases are also possible.

In some situations, the PCS in the receiver is configured to detect some of the types of errors noted above. For example, if a data block is changed to a terminal block due to corruption in the preamble bits as described in the first case above, the PCS can detect this block as invalid if the following block is a data block or a terminal block, instead of a control block or a start block (as would normally be the case without errors where a terminal block is followed by a control block or start block). As another example, if a terminal block is corrupted and changed into a data block, the PCS in the receiver can detect this block as invalid if the following block is a control block.

However, in some situations, the PCS in the receiver may not detect some of the types of errors noted above. For example, the PCS may fail to detect an error that occurs when the length of the encoded Ethernet packet is increased because the location of the EOP field in the terminal block (e.g., EOP field 354) is changed due to a corruption in the type field of the terminal block (e.g., type field 352). Such an error can happen, for example, due to a 4-bit burst that flips four consecutive bits in the type field of the terminal block. In such cases, the PCS can accept a corrupted transmission frame as valid. Accordingly, the PCS can decode the Ethernet packet from a corrupted transmission frame as valid, even if there are errors in the content of the Ethernet packet due to the errors in the underlying transmission frame.

The failure of the PCS at the receiver to detect such transmission frame errors can result in a lower value of a false packet acceptance rate metric at the receiver, e.g., MTTFPA. In such cases, false packets (e.g., Ethernet packets with errors) can be accepted at time intervals lower than a desired or target value of the MTTFPA. In this context, the MTTFPA is a network performance metric that measures an average time from an initial reception of a data packet, encoded in a transmission frame, to a time when a data packet encoded in a corrupted transmission frame is incorrectly processed as valid. For example, the MTTFPA measures the average time from a time when the PCS at a receiver processes an initial Ethernet packet encoded in a 64B/66B encoded transmission frame to a time when the PCS accepts as valid a corrupted 64B/66B encoded transmission frame and retrieves the Ethernet packet encoded within the corrupted transmission frame.

In some situations, the target value of MTTFPA at a receiver is set to be the Age of the Universe (AOU), which is industry-accepted standard. The AOU is a very large number, e.g., on the order of $10^{10}$ billion years, or some other suitable number. As described above, the PCS at the receiver can process a corrupted transmission frame as valid when there are burst errors in the type field of the terminal block that the PCS fails to detect. If such burst errors occur frequently, then the PCS at the receiver can accept corrupted transmission frames more frequently than the target AOU value, and thereby the MTTFPA at the PCS can be shortened. For example, for bit error rates (BER) on the order of $10^{-12}$ that elongate Ethernet packets encoded in 64B/66B encoded transmission frames, the MTTFPA at the receiver can range between $4.04 \times 10^7$ to $1.23 \times 10^9$ years, which is less than the target AOU value noted above.

The false packet acceptance described above can occur, for example, when additional error checking mechanisms are not used for the transmission frame, for example when error correction (FEC) codes are not used to detect DFE error propagation. In such cases, the PCS at a receiver may accept Ethernet packets in corrupted transmission frames more frequently, which can reduce the efficiency of data transmission over the communication channels and thereby affect network performance, which can be reflected in the lower value of the MTTFPA below the target value (e.g., AOU). It may be useful to add mechanisms such that the PCS at the receiver can detect the burst errors described above, and thereby achieve the target value of the MTTFPA. In some implementations, as described in greater detail below, an additional length check value or an additional error detection code value, or both, are added to the transmission frames such that the PCS at the receiver can detect burst errors in the transmission frames that elongate Ethernet packets encoded in the transmission frames.

FIGS. 4A, 4B, 4C and 4D illustrate block diagrams of sections of 64B/66B encoded transmission frames 400A, 400B, 400C and 400D respectively, with additional length field or error detection code field. In some implementations, the transmission frame sections 400A, 400B, 400C and 400D correspond to the terminal block of a 64B/66B encoded transmission frame that encodes an Ethernet packet, for example terminal block 320 of the transmission frame 300. Accordingly, the following sections describe the transmission frame sections 400A, 400B, 400C and 400D with respect to the terminal block 320 of the transmission frame 300. However, in other implementations, the transmission frame sections 400A, 400B, 400C and 400D can correspond to sections of transmission frames that are encoded with line codes different from 64B/66B line code. In some implementations, the transmission frame sections 400A, 400B, 400C and 400D can correspond to sections of transmission frames that encode data packets other than Ethernet packets.

Figure 4A:
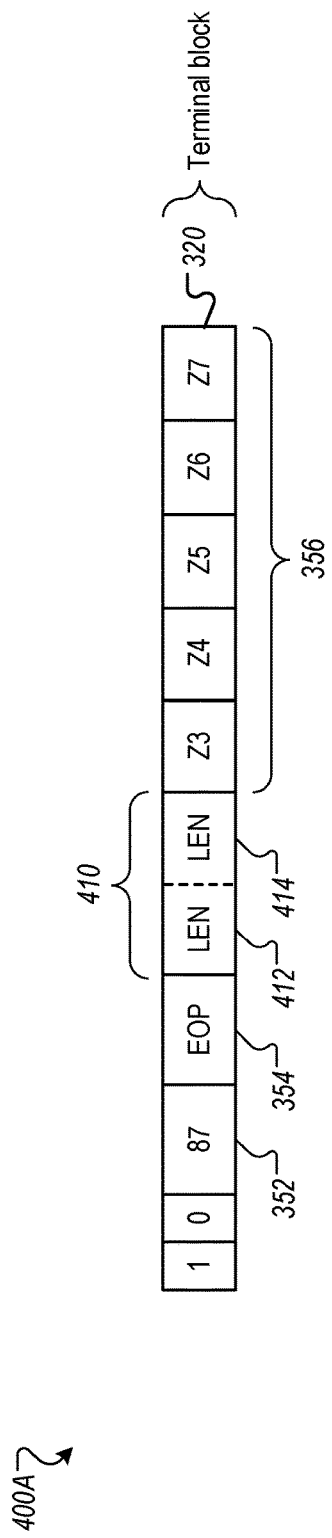
FIGS. 4A, 4B, 4C and 4D illustrate block diagrams of sections of 64B/66B transmission frames with an additional length field or error detection code field.

In some implementations, the PCS in the network interface of the transmitter performs a length check on the transmission frame, and inserts the length check value into a length field 410 into the terminal block 320 following the EOP field 354, as shown by the transmission frame section 400A in FIG. 4A. The transmitter PCS inserts the length field 410 by replacing two existing idle fields in the terminal block of the 64B/66B encoded transmission frame. In some implementations, the length field 410 is inserted in the positions of the two idle fields immediately following the EOP field 354, e.g., Z1 and Z2 of the terminal block 320 as shown in the transmission frame 300. In such implementations, the length field 410 is followed by five idle fields Z3-Z7, which is used by the receiver PCS to differentiate this transmission frame from the next transmission frame.

In some implementations, the length field 410 is inserted in a different location following the EOP field 354, e.g., by replacing idle fields Z2 and Z3, or the idle fields Z1, Z2 and Z3, of the terminal block 320 as shown in the transmission frame 300. In such implementations, the length field 410 is followed by four idle fields Z4-Z7, which is used by the receiver PCS to differentiate this transmission frame from the next transmission frame. Other suitable configurations are also possible.

In some implementations, the transmitter PCS performs the length check on the Ethernet packet received from the data link layer prior to encoding using the 64B/66B line code. For example, the transmitter PCS can perform a length check on the fields DA 106, SA 108, T/L 110, payload 112 and FCS 114 of an Ethernet packet received from the data link layer. The transmitter PCS then encodes the Ethernet packet into the transmission frame 300, and inserts the length check value into the length field 410.

In some implementations, the transmitter PCS performs the length check on the Ethernet packet encoded in the transmission frame. For example, the transmitter PCS can encode an Ethernet packet received from the data link layer into the transmission frame 300, and perform the length check on the octets D0-D7 of the data blocks 304-318 of the transmission frame 300. Other implementations are also possible. For example, the transmitter PCS can perform the length check on other sections of the transmission frame, e.g., the control and data octets included in the blocks 302-318.

In some implementations, the length field 410 includes a 14-bit length check value. This may be the case, for example, when the length field 410 replaces two idle fields, such as Z1 and Z2, each of which is 7-bits. The portions 412 and 414 of the length field 410 indicate the underlying idle fields Z1 and Z2 that are replaced. Each portion 412 or 414 is 7-bits in length. However, in other implementations, the length field 410 includes a length check value with a different number of bits, e.g., between 15 and 21 bits. This may be the case, for example, when the length field 410 replaces three idle fields, such as Z1, Z2 and Z3, each of which is 7-bits.

When a transmission frame with the length field 410 is processed by a receiver, the PCS in the network interface of the receiver obtains the length check value from the length field 410, and performs a validity check on the encoded Ethernet packet using the length check value. The receiver PCS accepts the encoded Ethernet packet as valid if the validity check is successful. The processes performed by the receiver PCS are described in greater detail in the following sections.

Figure 4B:
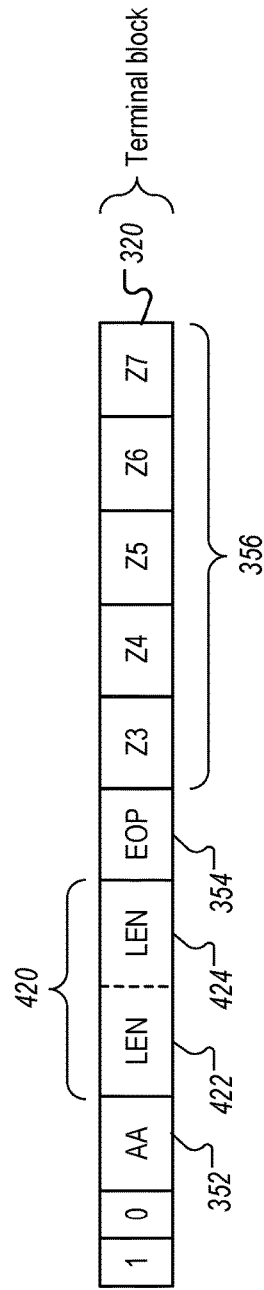

FIG. 4B illustrates an example of a transmission frame section 400B with a different configuration of a length field. In some implementations, the transmitter PCS performs a length check on the transmission frame, and inserts the length check value into a length field 420 into the terminal block 320 that precedes the EOP field 354, as shown by the transmission frame section 400B. The transmitter PCS inserts the length field 420 by removing existing idle fields and shifting the position of the EOP field 354.

In some implementations, the transmitter PCS removes two idle fields (e.g., Z1 and Z2 of the terminal block 320 as shown in the transmission frame 300), moves the position of the EOP field 354 and changes the EOP field 354 to a 6-bit field, and also changes an idle field (e.g., Z3) to a 6-bit field. The transmitter PCS inserts the length field 420 between the 7-bit type field 352 and the 7-bit EOP field 354. In such implementations, the EOP field 354 is followed by five idle fields Z3-Z7, which is used by the receiver PCS to differentiate this transmission frame from the next transmission frame. The transmitter PCS also updates the value of the type field 352 (e.g., updated from 87 to AA), which indicates the updated position of the EOP field 354. The updated value of the type field 352 can also indicate to the receiver PCS that the length field 420 has been inserted following the type field 352 and preceding the EOP field 354.

In some implementations, the transmitter PCS performs the length check on the Ethernet packet received from the data link layer prior to 64B/66B encoding. For example, the transmitter PCS can perform a length check on the fields DA 106, SA 108, T/L 110, payload 112 and FCS 114 of an Ethernet packet received from the data link layer. The transmitter PCS then encodes the Ethernet packet into the transmission frame 300, and inserts the length check value into the length field 420.

In some implementations, the transmitter PCS performs the length check on the Ethernet packet encoded in the transmission frame. For example, the transmitter PCS can encode an Ethernet packet received from the data link layer into the transmission frame 300, and perform the length check on the octets D0-D7 of the data blocks 304-318 of the transmission frame 300. Other implementations are also possible. For example, the transmitter PCS can perform the length check on other sections of the transmission frame, e.g., the control and data octets included in the blocks 302-318.

In some implementations, the length field 420 includes a 16-bit length check value. This may be the case, for example, when the length field 420 replaces two idle fields, such as Z1 and Z2, each of which is 7-bits, and also shortens the lengths of the EOP field 354 and an idle field, such as Z3 (each of which is changed from a 7-bit field to a 6-bit field). The portions 422 and 424 of the length field 420 each represent an 8-bit section of the length field 420. However, in other implementations, the length field 420 includes a length check value with a different number of bits, e.g., between 14 or 15 bits. This may be the case, for example, when one or more bits in the length field 420 are not used to store the length check value.

When a transmission frame with the length field 420 is processed by a receiver, the PCS in the network interface of the receiver obtains the length check value from the length field 420, and performs a validity check on the encoded Ethernet packet using the length check value. The receiver PCS accepts the encoded Ethernet packet as valid if the validity check is successful. The processes performed by the receiver PCS are described in greater detail in the following sections.

Figure 4C:
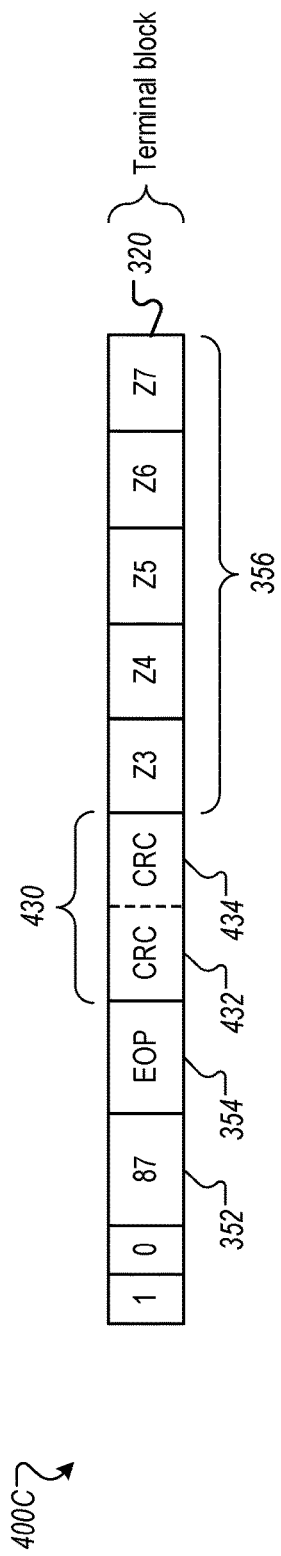

In some implementations, the transmitter PCS performs an error detection code check (e.g., a CRC check) on the transmission frame, and inserts the error detection code value (e.g., CRC parity value) into the transmission frame. FIG. 4C illustrates an example of a transmission frame section 400C that includes a CRC parity value in an error detection code field 430 of the terminal block 320 following the EOP field 354. The transmitter PCS computes the CRC parity value in the code field 430 in addition to the error detection code value in the FCS field (e.g., FCS 114) of the encoded Ethernet packet, which is computed by the data link layer.

The transmitter PCS inserts the code field 430 by replacing two existing idle fields in the terminal block of the 64B/66B encoded transmission frame. In some implementations, the code field 430 is inserted in the positions of the two idle fields immediately following the EOP field 354, e.g., Z1 and Z2 of the terminal block 320 as shown in the transmission frame 300. In such implementations, the code field 430 is followed by five idle fields Z3-Z7, which is used by the receiver PCS to differentiate this transmission frame from the next transmission frame.

In some implementations, the code field 430 is inserted in a different configuration following the EOP field 354, e.g., by replacing idle fields Z2 and Z3, or the idle fields Z1, Z2 and Z3, of the terminal block 320 as shown in the transmission frame 300. In such implementations, the code field 430 is followed by four idle fields Z4-Z7, which is used by the receiver PCS to differentiate this transmission frame from the next transmission frame. Other suitable configurations are also possible.

In some implementations, the transmitter PCS performs the CRC parity check on the Ethernet packet received from the data link layer prior to 64B/66B encoding. For example, the transmitter PCS can compute a CRC parity value on the contents of the fields DA 106, SA 108, T/L 110, payload 112 and FCS 114 of an Ethernet packet received from the data link layer. The transmitter PCS then encodes the Ethernet packet into the transmission frame 300, and inserts the CRC parity value into the code field 430.

In some implementations, the transmitter PCS performs the CRC check on the Ethernet packet encoded in the transmission frame. For example, the transmitter PCS can encode an Ethernet packet received from the data link layer into the transmission frame 300, and compute the CRC parity value on the contents of the octets D0-D7 of the data blocks 304-318 of the transmission frame 300. Other implementations are also possible. For example, the transmitter PCS can perform the CRC check on contents of other sections of the transmission frame, e.g., the control and data octets included in the blocks 302-318.

In some implementations, the code field 430 is a 14-bit field. This may be the case, for example, when the code field 410 replaces two idle fields, such as Z1 and Z2, each of which is 7-bits. The portions 432 and 434 of the code field 430 indicate the underlying idle fields Z1 and Z2 that are replaced. Each portion 432 or 434 is 7-bits in length. However, in other implementations, the code field 430 includes a different number of bits, e.g., between 15 and 21 bits. This may be the case, for example, when the code field 410 replaces three idle fields, such as Z1, Z2 and Z3, each of which is 7-bits.

In some implementations, the transmitter PCS uses an 8-bit CRC algorithm (CRC8) to compute the CRC parity value stored in the code field 430, and stores the computed CRC parity value using 8 bits of the code field 430. In such cases, other bits of the code field 430 are unused. When CRC8 is used, the MTTFPA can range between $1.03 \times 10^{10}$ years and $3.15 \times 10^{10}$ years, which is greater than AOU. The value of MTTFPA in the range can depend on the probability of bit error propagation in the transmission frame.

In some implementations, other CRC algorithms can be used, e.g., 14-bit CRC (CRC14). When CRC14 is used, the computed CRC parity value is stored using 14 bits of the code field 430.

When a transmission frame with the code field 430 is processed by a receiver, the PCS in the network interface of the receiver obtains the CRC parity value from the code field 430, and performs a validity check on the encoded Ethernet packet using the CRC parity value. The receiver PCS accepts the encoded Ethernet packet as valid if the validity check is successful. The processes performed by the receiver PCS are described in greater detail in the following sections.

Figure 4D:
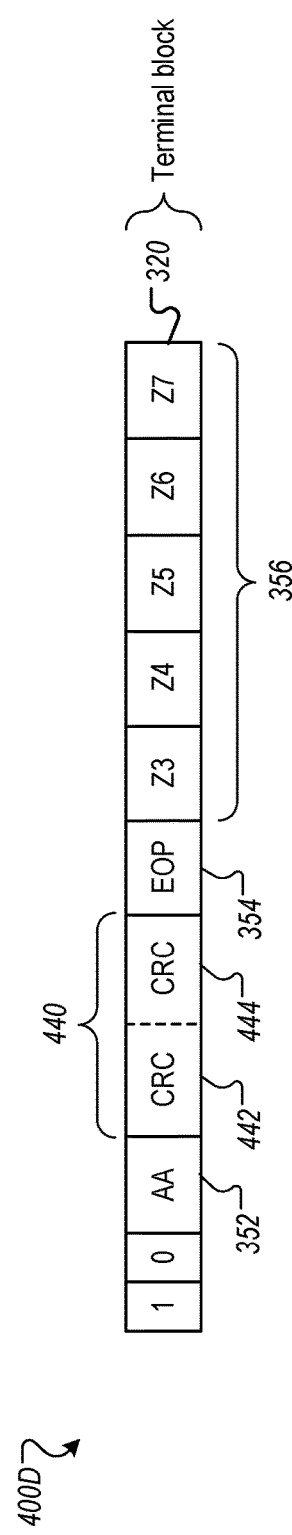

FIG. 4D illustrates an example of a transmission frame section 400D with a different configuration of a code field. In some implementations, the transmitter PCS performs a CRC parity check on the transmission frame, and inserts the CRC parity value into an error detection code field 440 into the terminal block 320 that precedes the EOP field 354, as shown by the transmission frame section 400D. The transmitter PCS inserts the code field 440 by removing existing idle fields and shifting the position of the EOP field 354.

In some implementations, the transmitter PCS removes two idle fields (e.g., Z1 and Z2 of the terminal block 320 as shown in the transmission frame 300), moves the position of the EOP field 354 and changes the EOP field 354 and an idle field (e.g., Z3) to 6-bit fields. The transmitter PCS inserts the code field 440 between the type field 352 and the EOP field 354. In such implementations, the EOP field 354 is followed by five idle fields Z3-Z7, which is used by the receiver PCS to differentiate this transmission frame from the next transmission frame. The transmitter PCS also updates the value of the type field 352 (e.g., updated from 87 to AA), which indicates the updated position of the EOP field 354. The updated value of the type field 352 can also indicate to the receiver PCS that the code field 440 has been inserted following the type field 352 and preceding the EOP field 354.

In some implementations, the transmitter PCS performs the CRC parity check on the Ethernet packet received from the data link layer prior to 64B/66B encoding. For example, the transmitter PCS can perform a CRC parity check on the fields DA 106, SA 108, T/L 110, payload 112 and FCS 114 of an Ethernet packet received from the data link layer. The transmitter PCS then encodes the Ethernet packet into the transmission frame 300, and inserts the CRC parity value into the code field 440.

In some implementations, the transmitter PCS performs the CRC parity check on the Ethernet packet encoded in the transmission frame. For example, the transmitter PCS can encode an Ethernet packet received from the data link layer into the transmission frame 300, and perform the CRC parity check on the octets D0-D7 of the data blocks 304-318 of the transmission frame 300. Other implementations are also possible. For example, the transmitter PCS can perform the CRC parity check on other sections of the transmission frame, e.g., the control and data octets included in the blocks 302-318.

In some implementations, the code field 440 is 16 bits in length. This may be the case, for example, when the code field 440 replaces two idle fields, such as Z1 and Z2, each of which is 7-bits, and also shortens the lengths of the EOP field 354 and an idle field, such as Z3 (each of which is changed from a 7-bit field to a 6-bit field). The portions 442 and 444 of the code field 440 each represent an 8-bit section of the length field 440.

In some implementations, the transmitter PCS uses a 16-bit CRC algorithm (CRC16) to compute the CRC parity value stored in the code field 440. When CRC16 is used, the MTTFPA can range between $2.65 \times 10^{12}$ years and $8.06 \times 10^{13}$ years, which is greater than AOU. The value of MTTFPA in the range can depend on the probability of bit error propagation in the transmission frame. Other suitable CRC algorithms can also be used, e.g., CRC14 or CRC8. When CRC14 or CRC8 is used, the computed CRC parity value is stored using, respectively, 14 bits or 8 bits of the code field 440.

When a transmission frame with the code field 440 is processed by a receiver, the PCS in the network interface of the receiver obtains the CRC parity value from the code field 440, and performs a validity check on the encoded Ethernet packet using the CRC parity value. The receiver PCS accepts the encoded Ethernet packet as valid if the validity check is successful. The processes performed by the receiver PCS are described in greater detail in the following sections.

In the manner described above, by using an additional length field 410 or 420, or an additional error detection code field 430 or 440, or both, the transmitter PCS and receiver PCS can detect errors in the transmission frame or the encoded Ethernet packet that would otherwise pass undetected by the error detection mechanisms used in the Ethernet packet. As noted previously, the encoded Ethernet packet can be a 10BASE-T Ethernet packet, a Fast Ethernet packet, a Gigabit Ethernet packet, a 10 G Ethernet packet, or a 25 G Ethernet packet, or some other suitable data packet. By detecting such errors using the length check value and/or the parity value stored in the field 410, 420, 430 or 440, the MTTFPA at the receiver can be increased to be greater than the target MTTFA (e.g., AOU). In some implementations, suitable error detection algorithms other than CRC8, CRC14 or CRC16 can be used to compute the error detection code value for the code fields 430 or 440.

Figure 5:
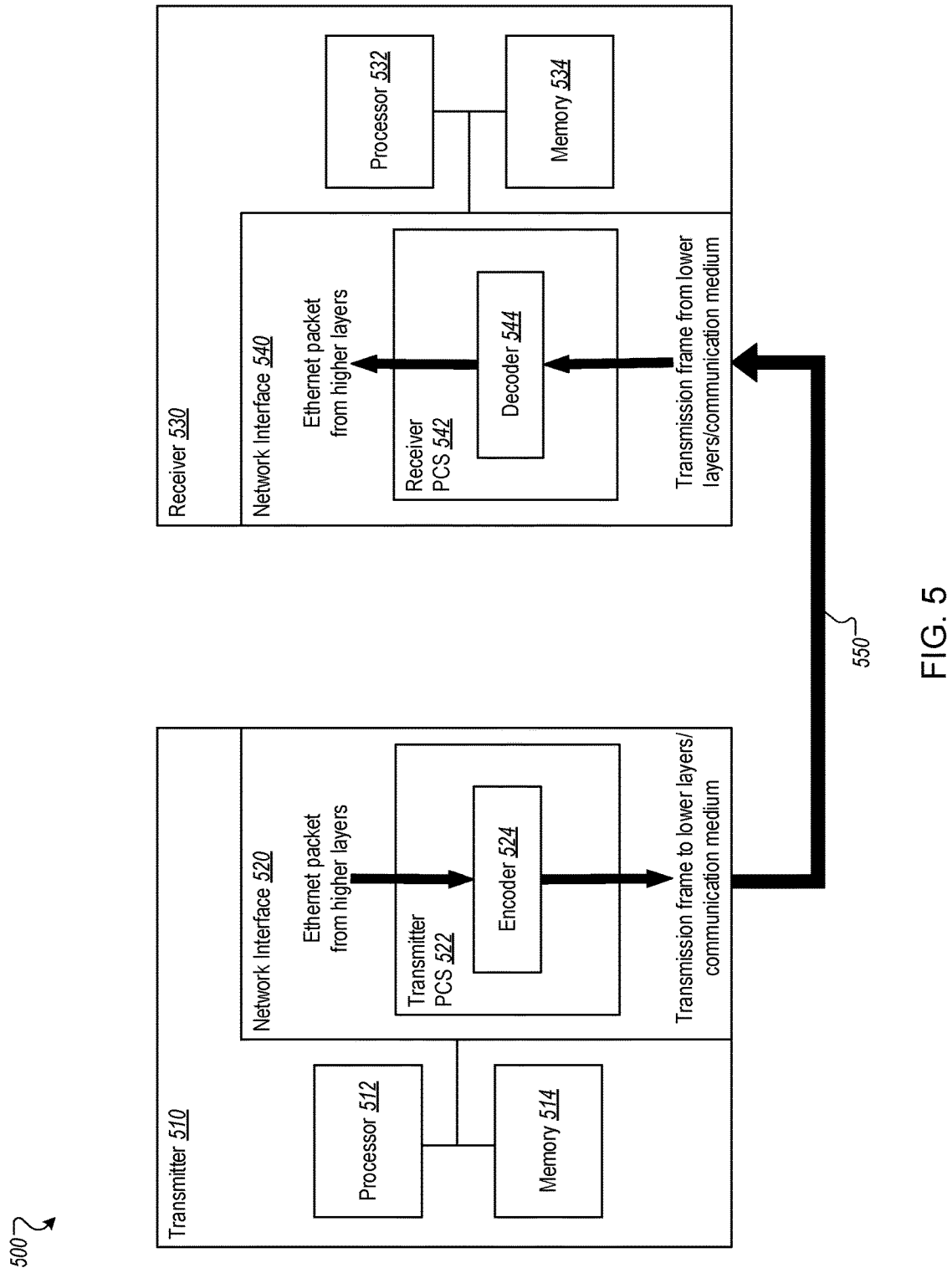
FIG. 5 illustrates an example of a system for processing Ethernet packets encoded in transmission frames with an additional length field or error detection code field.

FIG. 5 illustrates an example of a system 500 for processing Ethernet packets encoded in transmission frames with additional length field or error detection code field. The system 500 includes a transmitter 510, a receiver 530 and a communication medium 550 that connects the transmitter 510 and the receiver 530. The transmitter 510 and the receiver 530 are electronic devices with network interfaces that communicate with each other by establishing a network connection over the communication medium 550. The transmitter 510 and the receiver 530 exchange data packets over the established network connection. The data packets are encoded into transmission frames for sending over the communication medium 550. The transmitter 510 and the receiver 530 process validity values included in the transmission frames, e.g., an additional length field or error detection code field in the transmission frames, to check for errors in the transmission frames that can be introduced during sending over the communication medium 550. In some implementations, the transmitter 510 and the receiver 530 communicate using Ethernet packets that are encoded into transmission frames using 64B/66B line code, where the transmission frames include length field 410 or 420, or code field 430 or 440. In such cases, the communication medium 550 may correspond to a physical communication channel that implements the Ethernet protocol, e.g., an Ethernet cable.

The transmitter 510 includes a processor 512, a memory 514 and a network interface 520. The network interface 520 includes a network protocol stack whose functions are grouped into one or more layers, e.g., the network layer, the data link layer and the physical layer of the OSI model. In the physical layer, the network protocol stack includes functionality of transmitter PCS 522. One of the components of the transmitter PCS 522 is the encoder 524. In some implementations, the network interface 520 is implemented by a hardware circuit in the transmitter 510. In such cases, the transmitter PCS 522 (including, e.g., the encoder 524) is implemented as one or more units or components in the hardware circuit of the network interface 520.

The processor 512 is a microprocessor that is configured to execute instructions for sending data from the transmitter 510 to other network devices (e.g., receiver 530), and/or receiving data at the transmitter 510 from other network devices, among other functions. In some implementations, the processor executes instructions that are stored in the memory 514, which can be any suitable storage medium including a hard disk, read-only memory, random access memory, or flash memory. In some implementations, the memory 514 includes instructions that correspond to the functionalities of the network interface 520, e.g., the various processes and routines associated with the network protocol stack implemented in the network interface 520. In some implementations, these processes and routines associated with the network protocol stack of the network interface 520 include processes and routines that implement the functionality of the transmitter PCS 522, including that of the encoder 524.

In some implementations, the processor 512 executes instructions corresponding to the functionalities of the network interface 520 that are stored in memory included in the network interface 520, e.g., some suitable flash memory component of the network interface 520. These functionalities can include the various processes and routines associated with the network protocol stack implemented in the network interface 520, including those of the transmitter PCS 522, and that of the encoder 524.

The transmitter PCS 522 receives data packets from other processes in the network interface, and encodes the data packets into transmission frames for sending to the receiver over the communication medium 550. For example, in some implementations, the transmitter PCS 522 receives Ethernet packets from the data link layer processes. The transmitter PCS 522 uses the encoder 524 to generate a transmission frame that encodes the Ethernet packet (e.g., using 64B/66B line code).

In some implementations, the transmitter PCS 522 performs a length check while encoding the data packet into the transmission frame, and inserts the length check value into the transmission frame, as described previously. In some implementations, the transmitter PCS 522 performs an error detection code check while encoding the data packet into the transmission frame, and inserts the error detection code value into the transmission frame, as described previously. The transmitter PCS 522 forwards the transmission frame with the additional length check value, or the error detection code value, to the receiver over the communication medium 550.

The receiver 530 includes a processor 532, a memory 534 and a network interface 540. The network interface 540 includes a network protocol stack whose functions are grouped into one or more layers, e.g., the network layer, the data link layer and the physical layer of the OSI model. In the physical layer, the network protocol stack includes functionality of receiver PCS 542. One of the components of the receiver PCS 542 is the decoder 544. In some implementations, the network interface 540 is implemented by a hardware circuit in the receiver 530. In such cases, the receiver PCS 542 is implemented as one or more units or components in the hardware circuit of the network interface 540.

The processor 532 is a microprocessor that is configured to execute instructions for sending data from the receiver 530 to other network devices, and/or receiving data at the receiver 530 from other network devices (such as transmitter 510), among other functions. In some implementations, the processor 532 executes instructions that are stored in the memory 534, which can be any suitable storage medium including a hard disk, read-only memory, random access memory, or flash memory. In some implementations, the memory 534 includes instructions that correspond to the functionalities of the network interface 540, e.g., the various processes and routines associated with the network protocol stack implemented in the network interface 540. In some implementations, these processes and routines associated with the network protocol stack of the network interface 540 include processes and routines that implement the functionality of the receiver PCS 542, including that of the decoder 544.

In some implementations, the processor 532 executes instructions corresponding to the functionalities of the network interface 540 that are stored in memory included in the network interface 540, e.g., some suitable flash memory component of the network interface 540. These functionalities can include the various processes and routines associated with the network protocol stack implemented in the network interface 540, including those of the receiver PCS 542, and that of the decoder 544.

The receiver PCS 542 receives transmission frames from other network devices (e.g., transmitter 510) over the communication medium 550. In some implementations, the receiver PCS 542 receives 64B/66B encoded transmission frames from the transmitter 510 that encodes Ethernet packets. The receiver PCS 542 uses the decoder 544 to decode the transmission frame (e.g., using 64B/66B line code) and retrieve the encoded Ethernet packet from the transmission frame.

In some implementations, the receiver PCS 542 performs a length check while decoding the transmission frame. The receiver PCS 542 performs the length check in implementations where the transmitter PCS 522 inserts a length check value into the transmission frame sent to the receiver. The receiver PCS 542 determines a length value of data blocks in the transmission frame, and compares the computed value to the length check value that was inserted into the transmission frame by the transmitter PCS 522. The receiver PCS 542 accepts the transmission frame as valid if the computed value matches the length value inserted by the transmitter PCS 522, and accordingly extracts the data packet from the transmission frame (e.g., extracts the Ethernet packet from the 64B/66B encoded transmission frame using the decoder 544). If the computed value does not match the length value inserted by the transmitter PCS 522, the receiver PCS 542 rejects the transmission frame as corrupted.

In some implementations, the receiver PCS 542 performs an error detection code check while decoding the transmission frame. The receiver PCS 542 performs the error detection code check in implementations where the transmitter PCS 522 inserts an error detection code value into the transmission frame sent to the receiver. The receiver PCS 542 computes an error detection code value on the contents of the transmission frame, and compares the computed code value to the error detection code value that was inserted into the transmission frame by the transmitter PCS 522. The receiver PCS 542 accepts the transmission frame as valid if the computed code value matches the error detection code value inserted by the transmitter PCS 522, and accordingly extracts the data packet from the transmission frame (e.g., extracts the Ethernet packet from the 64B/66B encoded transmission frame using the decoder 544). If the computed code value does not match the error detection code value inserted by the transmitter PCS 522, the receiver PCS 542 rejects the transmission frame as corrupted.

As described previously, when the transmitter PCS 522 performs a length check on the transmission frame, the transmitter PCS 522 can insert the length check value into a length field into the terminal block of the transmission frame following the EOP field (e.g., length field 410 into the terminal block 320 as shown in the transmission frame section 400A). In such cases, the receiver PCS 542 obtains the length check value from the length field 410, and performs a validity check on the encoded Ethernet packet using the length check value. The receiver PCS 542 accepts the encoded Ethernet packet as valid if the validity check is successful.

Alternatively, the transmitter PCS 522 can insert the length check value into a length field into the terminal block of the transmission frame preceding the EOP field (e.g., length field 420 into the terminal block 320 as shown in the transmission frame section 400B). In such cases, the receiver PCS 542 obtains the length check value from the length field 420, and performs a validity check on the encoded Ethernet packet using the length check value. The receiver PCS 542 accepts the encoded Ethernet packet as valid if the validity check is successful.

When the transmitter PCS 522 performs an error detection code check on the transmission frame, the transmitter PCS 522 can insert the error detection code value into a code field into the terminal block of the transmission frame following the EOP field. For example, the transmitter PCS 522 can perform a CRC check on the contents of the transmission frame as described previously, and insert the CRC parity value in error detection code field 430 in the terminal block 320, as shown in transmission frame 400C. Alternatively, the transmitter PCS 522 can insert the error detection code value into a code field into the terminal block of the transmission frame preceding the EOP field. For example, the transmitter PCS 522 can insert the CRC parity value in error detection code field 440 in the terminal block 320, as shown in transmission frame 400D. In either case, the receiver PCS 542 performs a CRC parity check on the contents of the transmission frame received from the transmitter 510 over the communication medium 550. The receiver PCS 542 compares the computed CRC parity value to the CRC parity value obtained from the code field 430, or the code field 440. The receiver PCS 542 accepts the encoded Ethernet packet as valid if the two parity values match.

In some implementations, the length check and the error detection code check are performed in conjunction for an Ethernet packet encoded in a transmission frame. In such cases, the terminal block of the transmission frame includes both a length field and an error detection code field. The length field and the code field may be positioned after the EOP field in the transmission frame, or these fields may be positioned after the type field but preceding the EOP field in the transmission frame, in a manner similar to that described previously with respect to length field 410 or 420 and code field 430 or 440. In such cases, the transmitter PCS 522 performs a length check on the transmission frame and inserts the length check value into the length field. The transmitter PCS 522 also performs an error detection code check on the transmission frame and inserts the error detection code value into the code field into the terminal block of the transmission frame. In such cases, the receiver PCS 542 obtains the length check value from the length field and performs a validity check on the encoded Ethernet packet using the length check value. The receiver PCS 542 also performs a CRC parity check on the contents of the received transmission frame and compares the computed CRC parity value to the CRC parity value obtained from the code field of the received transmission frame. The receiver PCS 542 accepts the encoded Ethernet packet as valid if both the length check is successful and the parity values match.

In the manner described above, network devices, such as transmitter 510 and receiver 530, can exchange data packets over communication channels with validity values in the transmission frames. These validity values are used by the network devices to detect errors in the data packets that occur due to corruption in the transmission frames encoding the data packets, where such errors may not detected by other error checking mechanisms in the encoded data packets or the transmission frames. The validity values can be either a length check value that is inserted into a length field in the transmission frame, or an error detection code value inserted into a code field in the transmission frame, or both. In some implementations, the data packets are Ethernet packets that are encoded into 64B/66B encoded transmission frames, with the length check value or the error detection code value inserted into, respectively, a length field or a code field of a terminal block, as described in the preceding sections. However, in some implementations, other forms of data packets, and/or transmission frames using other forms of encoding, are processed in the manner described above.

Figure 6A:
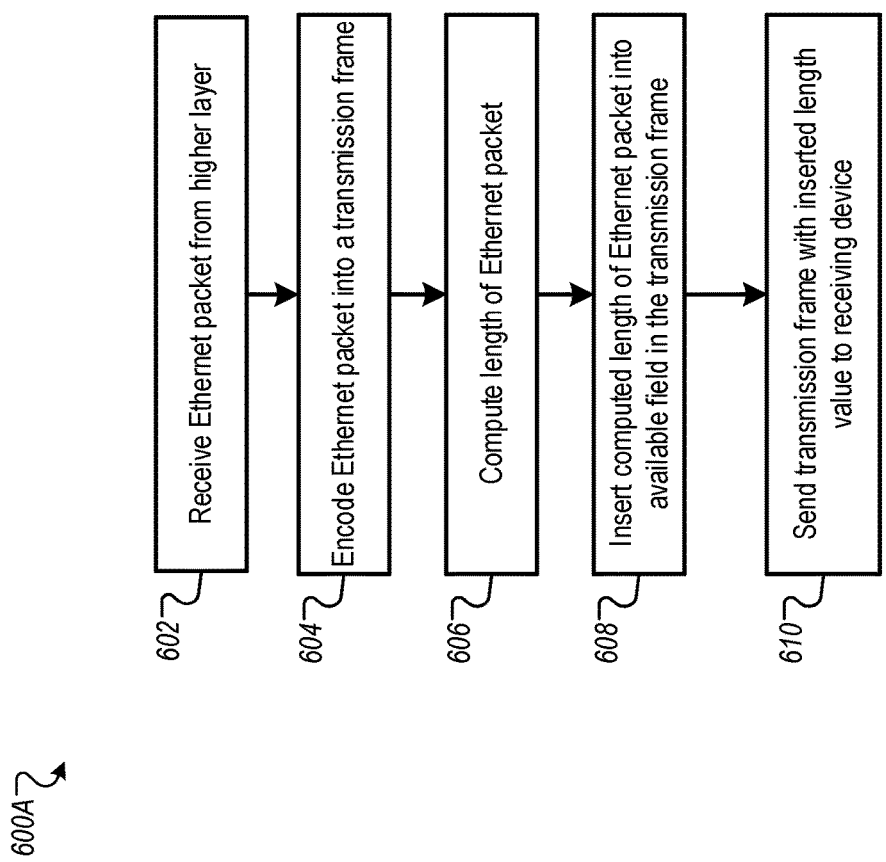
FIGS. 6A and 6B illustrate examples of processes for handling Ethernet packets encoded in transmission frames with an additional length field.
Figure 6B:
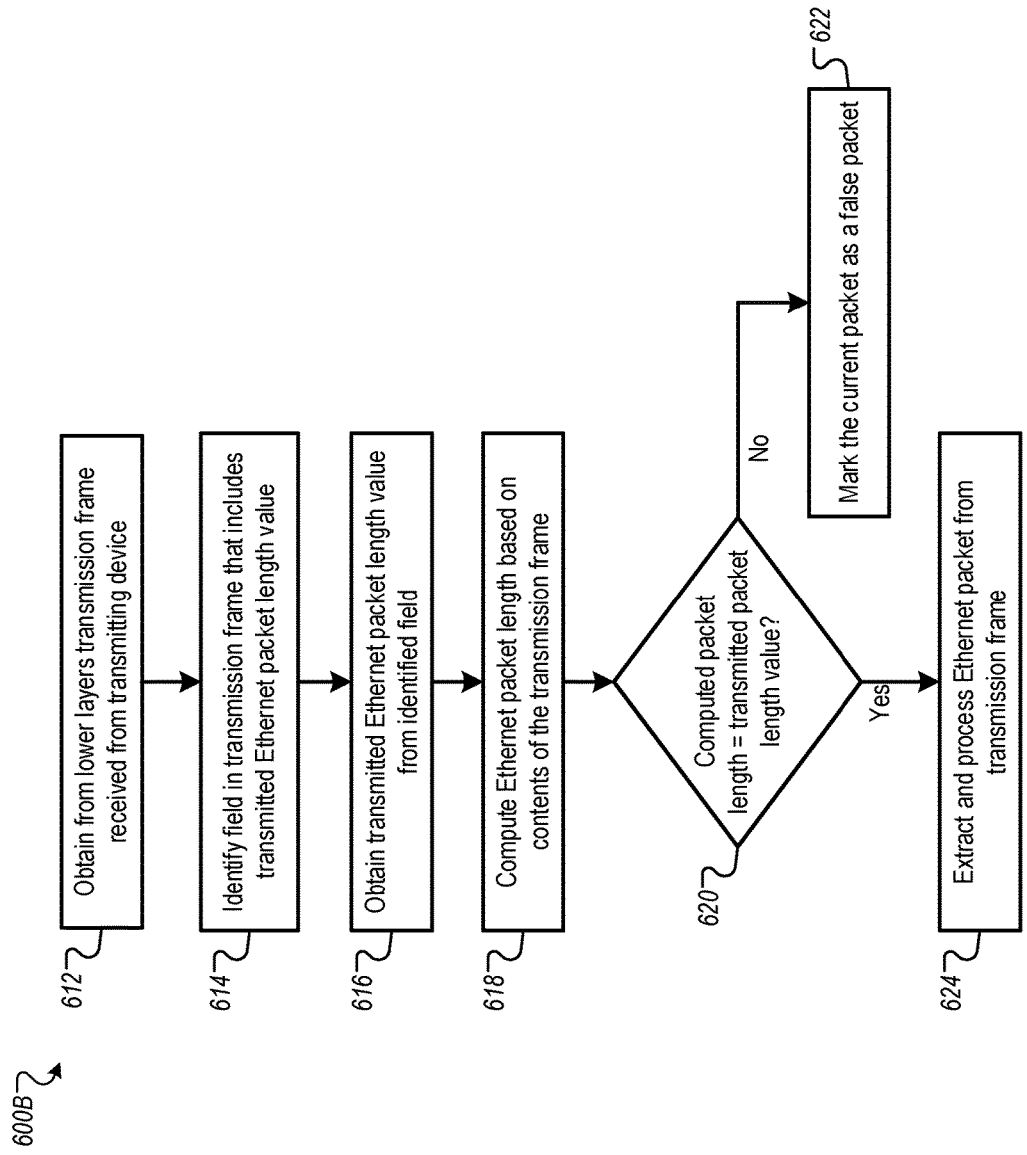

FIGS. 6A and 6B illustrate examples of processes 600A and 600B for handling Ethernet packets encoded in transmission frames with additional length field, according to some implementations. For example, the processes 600A and 600B may be performed respectively by the transmitter 510 and the receiver 530 of the system 500 to respectively send and receive 64B/66B encoded transmission frames that include an additional length field, such as length field 410 or 420. Accordingly, the following sections describe the process 600A with respect to the transmitter 510 and the process 600B with respect to the receiver 530. However, the processes 600A and/or 600B also may be performed by other suitable devices, or may be used to handle other type of data packets and/or transmission frames using other forms of encoding.

In some implementations, the process 600A shown in FIG. 6A is performed by one or more processors associated with the transmitter 510, such as the processor 512, which execute instructions stored in memory coupled to the device, such as memory 514, or memory included in the network interface 520. As noted previously, these instructions correspond to functionalities of the network interface 520, e.g., the various processes and routines associated with the network protocol stack implemented in the network interface 520, including the functionality of the transmitter PCS 522.

Similarly, in some implementations, the process 600B shown in FIG. 6B is performed by one or more processors associated with the receiver 530, such as the processor 532, which execute instructions stored in memory coupled to the device, such as memory 534, or memory included in the network interface 540. These instructions correspond to the functionalities of the network interface 540, e.g., the various processes and routines associated with the network protocol stack implemented in the network interface 540, including the functionality of the receiver PCS 542.

Referring to the process 600A performed by the transmitter, at 602, an Ethernet packet is received from a higher layer. For example, the transmitter PCS 522 receives an Ethernet packet (such as Ethernet packet 100) from the data link layer of the network interface 520.

At 604, the Ethernet packet is encoded into a transmission frame. For example, the transmitter PCS 522 encodes the Ethernet packet into a transmission frame using 64B/66B line code.

At 606, length of the Ethernet packet is computed. For example, in some implementations, the transmitter PCS 522 computes a length of the Ethernet packet based on the fields DA 106, SA 108, T/L 110, payload 112 and FCS 114 of the Ethernet packet. This length computation may be performed before encoding the Ethernet packet into the 64B/66B encoded transmission frame. As another example, in some implementations, the PCS 522 computes a length of the data blocks of the 64B/66B encoded transmission frame (such as blocks 304-318 shown in transmission frame 300) during, and/or after, the Ethernet packet is encoded.

At 608, the computed length of the Ethernet packet is inserted into an available field in the transmission frame. For example, in some implementations, the transmitter PCS 522 generates a length field in the terminal block of the 64B/66B encoded transmission frame following the EOP field, such as length field 410 shown in transmission frame section 400A, and inserts the computed length value into this length field. As another example, the transmitter PCS 522 generates a length field in the terminal block of the 64B/66B encoded transmission frame preceding the EOP field, such as length field 420 shown in transmission frame section 400B, and inserts the computed length value into this length field.

At 610, the transmission frame with the inserted length value is sent to a receiving device. For example, the transmitter PCS 522 forwards the 64B/66B encoded transmission frame with the length value inserted into the length field 410, or 420 depending on the implementation, to lower sublayers in the physical layer (such as PMA 214 and PMD 216) for further processing, and then the transmission frame is sent to the receiver 530 over the communication medium 550. The operations of the receiver to process the transmission frame are described in the following sections with respect to the process 600B of FIG. 6B.

Referring to the process 600B performed by the receiver, at 612, a transmission frame that is received from a transmitting device is obtained from lower layers. As noted above, in some implementations, the transmission frame that is received by the receiver at 612 is sent by the transmitter following the operations at 610 of the process 600A. For example, the receiver PCS 542 receives, from other processes in the physical layer of the receiver network interface 540 (such as the PMA 214 and PMD 216), a 64B/66B encoded transmission frame with the length field 410, or length field 420, depending on the implementation, which was sent by the transmitter PCS 522.

At 614, a field in the transmission frame that includes transmitted Ethernet packet length value is identified. For example, the receiver PCS 542 identifies the position of the length field 410, or the length field 420 as the case may be, in the terminal block of the 64B/66B encoded transmission frame. In implementations where the transmitter PCS 522 inserts the length value into the length field 410, the receiver PCS 542 identifies the bits of the length field 410 following the EOP field 354. In implementations where the transmitter PCS 522 inserts the length value into the length field 420, the receiver PCS 542 can identify the position of the length field 420 by determining the value of the type field 352 (e.g., 'AA', as shown in transmission frame section 400B), which can indicate that the length field 420 follows the type field 352 and precedes the EOP field 354. In some cases the transmitter PCS and the receiver PCS may be synchronized such that the receiver PCS knows the position of the length field 410 or the length field 420 in the terminal block of the transmission frame.

At 616, the transmitted Ethernet packet length value is obtained from the identified field. For example, the receiver PCS 542 retrieves the length value that is inserted into the length field 410, or the length field 420, as the case may be, by the transmitter PCS 522.

At 618, the Ethernet packet length is computed based on the contents of the transmission frame. For example, in some implementations, the receiver PCS 542 computes a length of the contents of the data blocks of the 64B/66B encoded transmission frame (such as blocks 304-318 shown in transmission frame 300, which are expected to correspond to the encoded Ethernet packet in the absence of errors) that is received from the transmitter PCS 522.

At 620, a determination is made whether the computed packet length is equal to the transmitted packet length value. For example, the receiver PCS 542 compares the Ethernet packet length that it computes at 618 with the Ethernet packet length value that it obtains from the length field 410 or the length field 420 at 616.

At 622, the current packet is marked as a false packet if the computed packet length value does not equal the transmitted packet length value. For example, upon performing the comparison at 620, the receiver PCS 542 may determine that the computed packet length is different from the packet length value that the transmitter PCS 522 had inserted in the length field 410 (or 420). In such a case, the receiver PCS 542 may determine that the transmission frame has encountered bit errors while being sent from the transmitter 510 to the receiver 530, such that the bits of the transmission frame that correspond to the encoded Ethernet packet cannot be determined reliably. Accordingly, the receiver PCS 542 may mark the Ethernet packet encoded in the transmission frame as a false packet. In some implementations, the receiver PCS 542 may discard the Ethernet packet as corrupted.

In the alternative, at 624, the Ethernet packet is extracted from the transmission frame and processed. For example, upon performing the comparison at 620, the receiver PCS 542 may determine that the computed packet length is same as the packet length value that the transmitter PCS 522 had computed and transmitted in the length field 410 (or 420). In such a case, the receiver PCS 542 may determine that the transmission frame has not encountered bit errors while being sent from the transmitter 510 to the receiver 530, such that the encoded Ethernet packet can be obtained reliably from the transmission frame. Accordingly, the receiver PCS 542 may decode the transmission frame to retrieve the Ethernet packet. Then the PCS 542 may send the decoded Ethernet packet to other routines in the network interface 540 for further processing, e.g., to routines implementing the functionalities of the data link layer. The data link layer may perform additional checks (e.g., parity check using the value of FCS field 114) to determine whether there are errors in the content of the Ethernet packet.

Figure 7A:
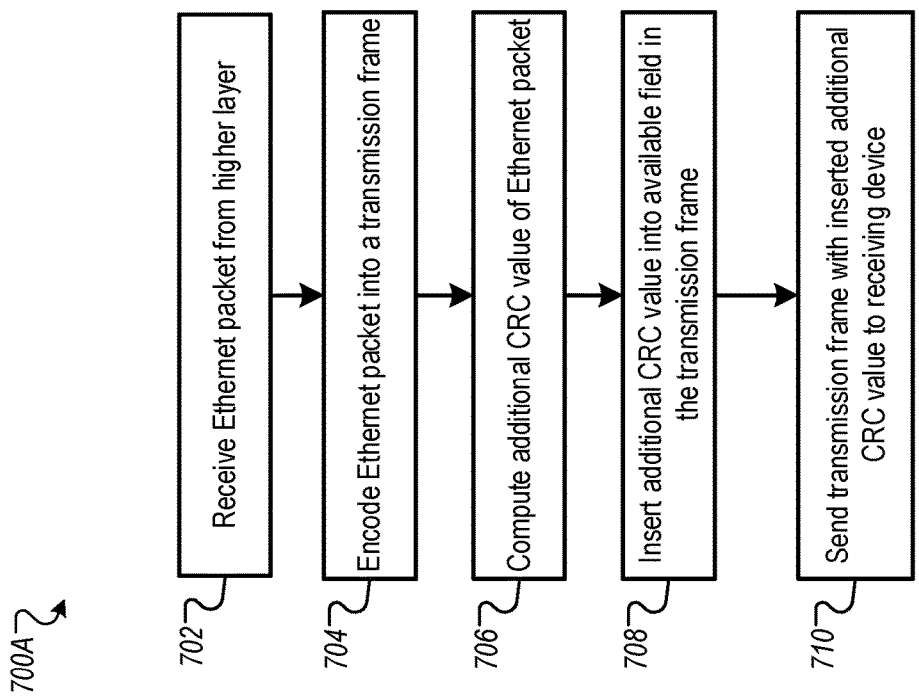
FIGS. 7A and 7B illustrate examples of processes for handling Ethernet packets encoded in transmission frames with an additional error detection code field.
Figure 7B:
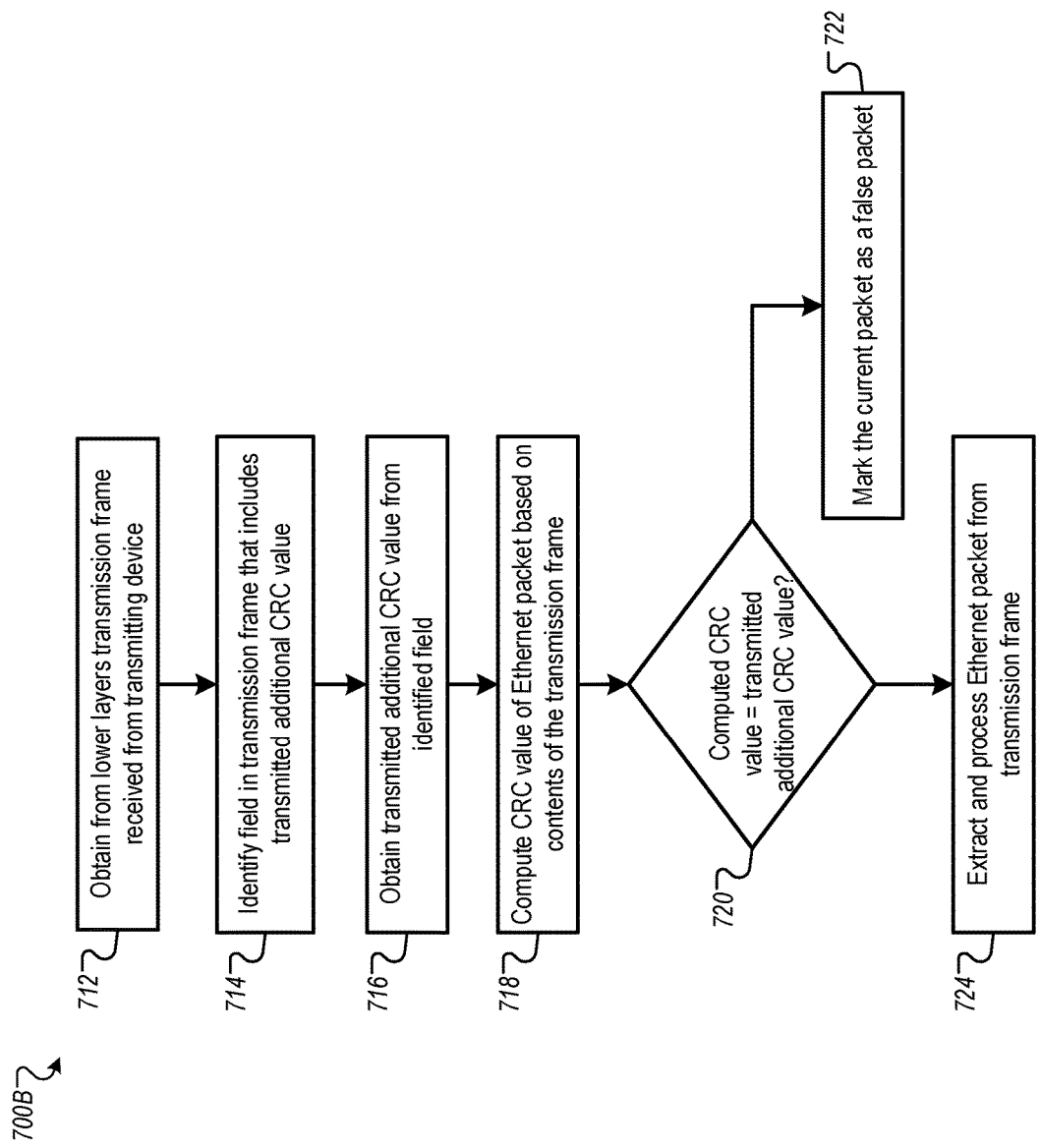

FIGS. 7A and 7B illustrate examples of processes 700A and 700B for handling Ethernet packets encoded in transmission frames with additional error detection code field, according to some implementations. For example, the processes 700A and 700B may be performed respectively by the transmitter 510 and the receiver 530 of the system 500 to respectively send and receive 64B/66B encoded transmission frames that include an additional error detection code field, such as code field 430 or 440. Accordingly, the following sections describe the process 700A with respect to the transmitter 510, and the process 700B with respect to the receiver 530. However, the processes 700A and/or 700B also may be performed by other suitable devices, or may be used to handle other types of data packets and/or transmission frames using other forms of encoding.

In some implementations, the process 700A shown in FIG. 7A is performed by one or more processors associated with the transmitter 510, such as the processor 512, which execute instructions stored in memory coupled to the device, such as memory 514, or memory included in the network interface 520. As noted previously, these instructions correspond to functionalities of the network interface 520, e.g., the various processes and routines associated with the network protocol stack implemented in the network interface 520, including the functionality of the transmitter PCS 522.

Similarly, in some implementations, the process 700B shown in FIG. 7B is performed by one or more processors associated with the receiver 530, such as the processor 532, which execute instructions stored in memory coupled to the respective device, such as memory 534, or memory included in the network interface 540. These instructions correspond to the functionalities of the network interface 540, e.g., the various processes and routines associated with the network protocol stack implemented in the network interface 540, including the functionality of the receiver PCS 542.

Referring to the process 700A performed by the transmitter, at 702, an Ethernet packet is received from a higher layer. For example, the transmitter PCS 522 receives an Ethernet packet (such as Ethernet packet 100) from the data link layer of the network interface 520.

At 704, the Ethernet packet is encoded into a transmission frame. For example, the transmitter PCS 522 encodes the Ethernet packet into a transmission frame using 64B/66B line code.

At 706, an additional CRC value of the Ethernet packet is computed. For example, in some implementations, the transmitter PCS 522 computes a CRC parity value on the contents of the Ethernet packet, such as the contents of the fields DA 106, SA 108, T/L 110, payload 112 and FCS 114. This CRC computation may be performed before encoding the Ethernet packet into the 64B/66B encoded transmission frame. As another example, in some implementations, the PCS 522 computes a CRC parity value on the contents of the data blocks of the 64B/66B encoded transmission frame (such as blocks 304-318 shown in transmission frame 300) during, and/or after, the Ethernet packet is encoded. The CRC parity value is computed by the transmitter PCS in addition to the CRC value computed by the data link layer, e.g., the CRC value in the FCS field 114 of the Ethernet packet. The transmitter PCS 522 uses a suitable CRC algorithm in computing the CRC parity value as discussed previously, e.g., CRC16, CRC14 or CRC8, among others.

At 708, the additional CRC value is inserted into an available field in the transmission frame. For example, in some implementations, the transmitter PCS 522 generates an error detection code field in the terminal block of the 64B/66B encoded transmission frame following the EOP field, such as code field 430 shown in transmission frame section 400C, and inserts the computed CRC parity value into this code field. As another example, the transmitter PCS 522 generates a code field in the terminal block of the 64B/66B encoded transmission frame preceding the EOP field, such as code field 440 shown in transmission frame section 400D, and inserts the computed CRC parity value into this code field.

At 710, the transmission frame with the inserted additional CRC value is sent to a receiving device. For example, the transmitter PCS 522 forwards the 64B/66B encoded transmission frame with the CRC parity value inserted into the code field 430, or 440 depending on the implementation, to lower sublayers in the physical layer (such as PMA 214 and PMD 216) for further processing, and then the transmission frame is sent to the receiver 530 over the communication medium 550. The operations of the receiver to process the transmission frame are described in the following sections with respect to the process 700B of FIG. 7B.

Referring to the process 700B, at 712, a transmission frame that is received from a transmitting device is obtained from lower layers. As noted above, in some implementations, the transmission frame that is received by the receiver at 712 is sent by the transmitter following the operations at 710 of the process 700A. For example, the receiver PCS 542 receives, from other processes in the physical layer of the receiver network interface 540 (such as the PMA 214 and PMD 216), a 64B/66B encoded transmission frame with the code field 430, or code field 440, depending on the implementation, which was sent by the transmitter PCS 522.

At 714, a field in the transmission frame that includes the transmitted additional CRC value is identified. For example, the receiver PCS 542 identifies the position of the code field 430, or the code field 440 as the case may be, in the terminal block of the 64B/66B encoded transmission frame. In implementations where the transmitter PCS 522 inserts the CRC parity value into the code field 430, the receiver PCS 542 identifies the bits of the code field 430 following the EOP field 354. In implementations where the transmitter PCS 522 inserts the CRC parity value into the code field 440, the receiver PCS 542 can identify the position of the code field 440 by determining the value of the type field 352 (e.g., 'AA', as shown in transmission frame section 400B), which can indicate that the code field 440 follows the type field 352 and precedes the EOP field 354. In some cases the transmitter PCS and the receiver PCS may be synchronized such that the receiver PCS knows the position of the code field 430 or 440 in the terminal block of the transmission frame.

At 716, the transmitted additional CRC value is obtained from the identified field. For example, the receiver PCS 542 retrieves the CRC parity value that is inserted into the code field 430, or the code field 440, as the case may be, by the transmitter PCS 522.

At 718, a CRC value is computed based on the contents of the transmission frame. For example, in some implementations, the receiver PCS 542 computes a CRC parity value based on the contents of the data blocks of the 64B/66B encoded transmission frame (such as blocks 304-318 shown in transmission frame 300, which are expected to correspond to the encoded Ethernet packet in the absence of errors) that is received from the transmitter PCS 522. The receiver PCS 542 computes the CRC parity value using the same CRC algorithm as used by the transmitter PCS 522 at 706. In some implementations, the transmitter PCS and the receiver PCS are synchronized with information about which CRC algorithm to use. In other implementations, the receiver PCS may determine the appropriate CRC algorithm based on information included in the transmission frame. For example, the receiver PCS may determine the CRC algorithm based on the CRC parity value that is obtained from the code field 430 (or the code field 440, as the case may be).

At 720, a determination is made whether the computed CRC value is equal to the transmitted additional CRC value. For example, the receiver PCS 542 compares the CRC parity value that it computes at 718 with the CRC parity value that it obtains from the code field 430 or 440 at 716.

At 722, the current packet is marked as a false packet if the computed CRC value does not equal the transmitted additional CRC value. For example, upon performing the comparison at 720, the receiver PCS 542 may determine that the computed CRC parity value is different from the CRC parity value that the transmitter PCS 522 had computed and transmitted in the code field 430 (or 440). In such a case, the receiver PCS 542 may determine that the transmission frame has encountered bit errors while being sent from the transmitter 510 to the receiver 530, such that the bits of the encoded Ethernet packet cannot be determined reliably. Accordingly, the receiver PCS 542 may mark the Ethernet packet encoded in the transmission frame as a false packet. In some implementations, the receiver PCS 542 may discard the Ethernet packet as corrupted.

In the alternative, at 724, the Ethernet packet is extracted from the transmission frame and processed. For example, upon performing the comparison at 720, the receiver PCS 542 may determine that the computed CRC parity value equals the CRC parity value that the transmitter PCS 522 had computed and transmitted in the code field 430 (or 440, as applicable). In such a case, the receiver PCS 542 may determine that the transmission frame has not encountered errors while being sent from the transmitter 510 to the receiver 530, such that the encoded Ethernet packet can be obtained reliably from the transmission frame. Accordingly, the receiver PCS 542 may decode the transmission frame to retrieve the Ethernet packet. Then the PCS 542 may send the decoded Ethernet packet to other processes in the network interface 540 for further handling, e.g., to routines implementing the functionalities of the data link layer. The data link layer may perform additional checks (e.g., parity check using the value of FCS field 114) to determine whether there are errors in the content of the Ethernet packet.

The disclosed and other examples can be implemented as one or more computer program products, for example, one or more modules of computer program instructions encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A network device comprising:
   a network interface that includes a physical coding sublayer (PCS) unit, wherein the PCS unit is configured to
   receive an Ethernet packet,
   encode, using 64B/66B line code, the Ethernet packet into a transmission frame, wherein the transmission frame includes (i) a first set of bit fields corresponding to contents of the Ethernet packet, and (ii) a second set of bit fields forming a terminating block of the transmission frame and including control information for the 64B/66B encoding, and wherein the first set of bit fields includes data payload bits and other bits, compute a validity value of the transmission frame, wherein computing the validity value includes computing a length value of the transmission frame, wherein the length value is based on at least one of (i) a number of bits included in the data payload bits and at least a portion of the other bits, or (ii) a number of bits in a least a portion of the second set of bit fields, insert the validity value into the second set of bit fields of the terminating block, wherein insertion of the validity value into the second set of bit fields comprises determining a position of a 64B/66B end of packet (EOP) bit field in the terminating block, and inserting the validity value into one or more idle bit fields that are adjacent to the 64B/66B EOP bit field in the terminating block, wherein inserting the validity value of the transmission frame into the one or more idle bit fields adjacent to the 64B/66B EOP bit field comprises inserting the validity value into at least one idle bit field following the 64B/66B EOP bit field, process the transmission frame for sending to a receiving device over a physical medium; and transmitting the transmission frame from the network device to the receiving device to enable the receiving device to (i) perform a validity check on the transmission frame based on the length value, and (ii) accept the frame based on the validity check.

2. The network device of claim 1, wherein computing the validity value of the transmission frame comprises computing a first error-detecting code value of the transmission frame, wherein:

the first error-detecting code value is based on contents of the first set of bit fields;

the contents of the first set of bit fields includes a second error-detecting code value present in the Ethernet packet; and the second error-detecting code value is computed based on payload information of the Ethernet packet.

3. The network device of claim 2, wherein:

the first error-detecting code value includes a cyclic redundancy check (CRC) value of the first set of bit fields;

the second error-detecting code value included in the Ethernet packet includes a 32-bit CRC value; and the 32-bit CRC value is included in a frame check sequence (FCS) portion of the Ethernet packet.

4. The network device of claim 3, wherein the first CRC value includes one of an 8-bit CRC value or a 16-bit CRC value.

5. The network device of claim 1, wherein:

the length value is encoded as 14-bit data; and the 14-bit data is inserted into two of the one or more idle bit fields following the EOP bit field.

6. The network device of claim 1, wherein:

the second set of bit fields in the terminating block includes a type bit field;

the validity value includes the length value of the transmission frame;

the length value indicates a number of bits in the first set of bit fields; and inserting the length value of the transmission frame into the one or more idle bit fields that are adjacent to the 64B/66B EOP bit field comprises updating the type bit field in the terminating block to indicate adjusted location of the 64B/66B EOP bit field in the terminating block.

7. The network device of claim 6, wherein:

the length value is encoded as 16-bit data; and the 16-bit data is inserted into two of the one or more idle bit fields preceding the 64B/66B EOP bit field.

8. The network device of claim 1, wherein the length value is based on a number of bits in the first set of bit fields including the payload bits and the other bits.

9. The network device of claim 1, wherein the length value is based on a number of control information bits in at least one of the first set of bit fields or the second set of bit fields.

10. The network device of claim 1, wherein the length value is based on a number of bits in the least a portion of the second set of bit fields.

11. The network device of claim 1, wherein the length value is based on a length of the second set of bit fields.

12. The network device of claim 1, wherein the length value is based on a number of cyclical redundancy check bits in the transmission frame.

13. The network device of claim 1, wherein the length value is based on a number of bits associated with at least one of a destination address, a source address, a type/length field, and a frame check sequence of the transmission frame.

14. A method comprising:

receiving from a network device, at a physical coding sublayer (PCS) unit in a network interface of a transmitting device, an Ethernet packet;

encoding, by the PCS unit using a 64B/66B line code, the Ethernet packet into a transmission frame, wherein the transmission frame includes (i) a first set of bit fields corresponding to contents of the Ethernet packet, and (ii) a second set of bit fields forming a terminating block of the transmission frame and including control information for the 64B/66B encoding;

computing, by the PCS unit, a validity value of the transmission frame, wherein the validity value includes a length value of the transmission frame, and wherein the length value indicates a number of bits in the first set of bit fields included in the transmission frame;

inserting, by the PCS unit, the validity value into the second set of bit fields of the terminating block, wherein the second set of bit fields in the terminating block includes a type bit field, and wherein insertion of the validity value into the second set of bit fields comprises determining a position of a 64B/66B end of packet (EOP) bit field in the terminating block, and inserting the validity value into one or more idle bit fields that are adjacent to the 64B/66B EOP bit field in the terminating block, wherein the inserting of the validity value into the one or more idle bit fields comprises updating the type bit field in the terminating block to indicate adjusted location of the 64B/66B EOP bit field in the terminating block;

processing, by the PCS unit, the transmission frame for sending to a receiving device over a physical medium; and transmitting the transmission frame from the network device to the receiving device to enable the receiving device to (i) perform a validity check on the transmission frame based on the length value, and (ii) accept the frame based on the validity check.

15. The method of claim 14, wherein:

the length value is encoded as a 14-bit data; and the 14-bit data is inserted into two of the one or more idle bit fields following the EOP bit field.

16. The method of claim 14, wherein:

the length value is encoded as a 16-bit data; and the 16-bit data is inserted into two of the one or more idle bit fields preceding the 64B/66B EOP bit field.

17. The method of claim 14, wherein computing the validity value of the transmission frame comprises:

computing a first error-detecting code value of the transmission frame, wherein the first error-detecting code value is based on contents of the first set of bit fields, wherein the contents of the first set of bit fields includes a second error-detecting code value present in the Ethernet packet, and wherein the second error-detecting code value is computed based on payload information of the Ethernet packet; and inserting the first error-detecting code value into one or more available bit fields in the second set of bit fields.

18. The method of claim 17, wherein:

the first error-detecting code value includes a cyclic redundancy check (CRC) value of the first set of bit fields;

the second error-detecting code value included in the Ethernet packet includes a 32-bit CRC value; and the 32-bit CRC value is included in a frame check sequence (FCS) portion of the Ethernet packet.

19. The method of claim 18, wherein the first CRC value includes one of an 8-bit CRC value or a 16-bit CRC value.

20. A network device comprising:

a network interface that includes a physical coding sublayer (PCS) unit, wherein the PCS unit is configured to receive an Ethernet packet, encode, using 64B/66B line code, the Ethernet packet into a transmission frame, wherein the transmission frame includes (i) a first set of bit fields corresponding to contents of the Ethernet packet, and (ii) a second set of bit fields forming a terminating block of the transmission frame and including control information for the 64B/66B encoding, compute a validity value of the transmission frame including computing a length value of the transmission frame, wherein the length value is encoded as 14-bit data or 16-bit data, insert the validity value into the second set of bit fields of the terminating block, wherein insertion of the validity value into the second set of bit fields comprises determining a position of a 64B/66B end of packet (EOP) bit field in the terminating block, and inserting the validity value into one or more idle bit fields that are adjacent to the 64B/66B EOP bit field including inserting the length value into two of the one or more idle bit fields, process the transmission frame for sending to a receiving device over a physical medium; and transmitting the transmission frame from the network device to the receiving device to enable the receiving device to (i) perform a validity check on the transmission frame based on the length value, and (ii) accept the frame based on the validity check.

* * * * *